US012684839B2

(12) United States Patent
Kim et al.

(10) Patent No.: US 12,684,839 B2
(45) Date of Patent: Jul. 14, 2026

(54) SEMICONDUCTOR DEVICE

(71) Applicant: Samsung Electronics Co., Ltd., Suwon-si (KR)

(72) Inventors: Ki Hwan Kim, Suwon-si (KR); Kyung Ho Kim, Suwon-si (KR); Kang Hun Moon, Suwon-si (KR); Cho Eun Lee, Suwon-si (KR); Yong Uk Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 475 days.

(21) Appl. No.: 18/117,262

(22) Filed: Mar. 3, 2023

(65) Prior Publication Data

US 2023/0387206 A1 Nov. 30, 2023

(30) Foreign Application Priority Data

May 26, 2022 (KR) ........................ 10-2022-0064459

(51) Int. Cl.
H10D 84/85 (2025.01)
H10D 30/01 (2025.01)
(Continued)

(52) U.S. Cl.
CPC ......... H10D 62/151 (2025.01); H10D 30/014 (2025.01); H10D 30/43 (2025.01);
(Continued)

(58) Field of Classification Search
CPC ............. H10D 84/0193; H10D 84/853; H10D 30/6728; H10D 30/6733; H10D 30/6735;
(Continued)

(56) References Cited

U.S. PATENT DOCUMENTS 10,134,896 B2 11/2018 Tsai et al.
10,872,983 B2 12/2020 Yang et al.
(Continued)

FOREIGN PATENT DOCUMENTS

KR 2002-0078996 A 10/2002
KR 10-2005-0116707 A 12/2005
(Continued)

OTHER PUBLICATIONS

European Office Action dated Feb. 19, 2024 for corresponding application No. EP 23 169 315.1.
(Continued)

*Primary Examiner* — Moin M Rahman
(74) *Attorney, Agent, or Firm* — Muir Patent Law, PLLC

(57) ABSTRACT

A semiconductor device comprises an active pattern including a lower pattern and a plurality of sheet patterns that are spaced apart from the lower pattern in a first direction, a plurality of gate structures disposed on the lower pattern to be spaced apart from each other in a second direction, each of the gate structures including a gate electrode and gate insulating films, source/drain recesses defined between adjacent gate structures and a source/drain pattern filling the source/drain recesses. Each source/drain pattern may include a first semiconductor liner, which extend along sidewalls and a bottom surface of the source/drain recesses, second semiconductor liners, which are on the first semiconductor liners and extend along the sidewalls and the bottom surface of the source/drain recesses, and a filling semiconductor film, which is on the second semiconductor liners and fills the source/drain recess. The second semiconductor liners may be doped with carbon, and the first semiconductor liners may be in contact with the lower pattern and the sheet patterns, while the first semiconductor liners may include carbon-undoped regions.

18 Claims, 30 Drawing Sheets

(51) Int. Cl.
| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 64/66* | (2025.01) |

(52) U.S. Cl.
CPC ....... *H10D 30/6735* (2025.01); *H10D 62/121* (2025.01); *H10D 64/017* (2025.01); *H10D 64/679* (2025.01); *H10D 84/85* (2025.01)

(58) Field of Classification Search
CPC .. H10D 62/118; H10D 89/931; H10D 64/252; H10D 84/0188; H10D 84/201; H10D 18/60; H10D 30/62–6219; H10D 30/024–0245; H10D 84/0158; H10D 86/011; H10D 84/834; H10D 86/215; H10D 30/673; H10D 30/689; H10D 30/0323; H10D 30/6713; H10D 30/6744; H10D 30/6757; H10D 62/021; H10D 64/015; H10D 64/021; H10D 62/151; H10D 62/364; H10D 64/017; H10D 30/797; H10D 64/671; H10D 84/0165–0195; H10D 84/85–859; H10D 84/907–994; H10D 30/60–798; H10D 30/021–0415; H10D 84/83–859; H10D 84/0128; H10D 84/0167; H10D 62/85–854; H10D 30/751; H10D 30/027–0278; H10D 30/63; H10D 84/016; H10D 84/0195; H10D 30/501–509; H01L 21/76224; H01L 21/31116; H01L 21/30604; H01L 21/3065; H02K 15/027; A23B 2/783; A45C 11/003; A61K 40/4218; H10F 77/955; H10H 20/826; B82Y 10/00; H10B 12/36; H10B 12/056; H10B 63/34; B81C 2203/0728; B81C 2203/0735; B81C 2203/0742

See application file for complete search history.

(56) References Cited

U.S. PATENT DOCUMENTS

| | | | |
|---|---|---|---|
| 11,031,502 | B2 | 6/2021 | Jang et al. |
| 11,158,727 | B2 | 10/2021 | Wang et al. |
| 11,205,711 | B2 | 12/2021 | Wang et al. |
| 11,264,381 | B2 | 3/2022 | Lee et al. |
| 2018/0151733 | A1 | 5/2018 | Glass et al. |
| 2018/0294331 | A1 | 10/2018 | Cho et al. |
| 2020/0020774 | A1 | 1/2020 | Lee et al. |
| 2020/0219976 | A1* | 7/2020 | Kim ..................... H10D 62/151 |
| 2020/0395446 | A1* | 12/2020 | Yi .......................... B82Y 10/00 |
| 2021/0035870 | A1 | 2/2021 | Young et al. |
| 2021/0273098 | A1 | 9/2021 | Chang et al. |
| 2021/0375685 | A1 | 12/2021 | Xie et al. |
| 2022/0059654 | A1 | 2/2022 | Kim et al. |
| 2022/0069134 | A1 | 3/2022 | Kim et al. |
| 2022/0392894 | A1* | 12/2022 | More ................ H10D 30/6757 |

FOREIGN PATENT DOCUMENTS

| | | | |
|---|---|---|---|
| KR | 10-2018-0113118 | A | 10/2018 |
| KR | 10-2020-0007452 | A | 1/2020 |
| KR | 10-2020-0142158 | A | 12/2020 |
| KR | 10-2022-0030374 | A | 3/2022 |

OTHER PUBLICATIONS

European Search Report dated Feb. 7, 2024 for corresponding application No. EP 23 169 315.1.

* cited by examiner

—120_HM

—140p

—120p

—130p

ACT_L

SC_L

ACT_L

SC_L  } U_AP

ACT_L

SC_L

—BP1

—100

A                                    A 150R    150R

120_HM

140p

120p

130p

ACT_L
SC_L
ACT_L
SC_L    U_AP
ACT_L
SC_L

- 120_HM
- 140p
- 120p
- 130p
- ACT_L
- SC_L
- ACT_L
- SC_L ⟩ U_AP
- ACT_L
- SC_L

150R_ER

- 152
- 151 ⟩ 150
- 153
- 150R

BP1

100

A          A

D3
⊗→D1
D2

SEMICONDUCTOR DEVICE

CROSS-REFERENCE TO RELATED APPLICATION

This application claims priority from Korean Patent Application No. 10-2022-0064459 filed on May 26, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor device, and particularly, to a semiconductor device including a multi-gate transistor.

2. Description of the Related Art

As a scaling technique for increasing the density of a semiconductor device, a multi-gate transistor has been suggested in which a fin-type, nanowire-type or nano-sheet multi-channel active pattern (or silicon or other semiconductor body) is provided with a substrate and a gate is formed about the surface of the multi-channel active pattern.

Since the multi-gate transistor uses a three-dimensional (3D) channel, scaling can be facilitated. Also, current control capability can be improved without increasing the length of the gate of the multi-gate transistor. Also, a short channel effect (SCE), i.e., the phenomenon of the potential of a channel region being affected by a drain voltage, can be effectively suppressed.

SUMMARY

Aspects of the present disclosure provide provide a semiconductor device capable of improving device performance and reliability.

However, it will be appreciated that aspects of the present invention are not restricted to the detailed examples set forth herein. The above and other aspects of the present invention will become apparent to one of ordinary skill in the art by referencing the detailed exemplary description herein.

According to an aspect of the present disclosure, a semiconductor device comprises an active pattern including a lower pattern and a plurality of sheet patterns, which are spaced apart from the lower pattern in a first direction; a plurality of gate structures disposed on the lower pattern and spaced apart from each other in a second direction, each of the gate structures including a gate electrode and gate insulating film; source/drain recesses, each defined between a corresponding pair of the gate structures that are adjacent to each other; and source/drain patterns, each filling a corresponding one of the source/drain recesses. Each of the source/drain patterns may include a first semiconductor liner extending along sidewalls and a bottom surface of the of the source/drain recess, a second semiconductor liner on the first semiconductor liner and extending adjacent to the sidewalls and the bottom surface of the of the source/drain recess, and a filling semiconductor film on the second semiconductor liner and fills the source/drain recess. The second semiconductor liners may be doped with carbon. The first semiconductor liners may be in contact with the lower pattern and the sheet patterns, and the first semiconductor liners may include carbon-undoped regions.

According to some examples of the present disclosure, a semiconductor device comprises an active pattern including a lower pattern and a plurality of sheet patterns, which are spaced apart from the lower pattern in a first direction; a plurality of gate structures disposed on the lower pattern and spaced apart from each other in a second direction, each of the gate structures including a gate electrode and gate insulating films; a source/drain recesses, each defined between a corresponding pair of the gate structures that are adjacent to each other, each of the source/drain recesses including a plurality of width-expanded regions; and source/drain patterns, each filling a corresponding one of the source/drain recesses, wherein each of the gate structures includes inner gate structures each being disposed between a corresponding pair of adjacent sheet patterns or between the lower pattern and the sheet pattern adjacent to the lower pattern, the inner gate structures including a corresponding portion of the gate electrode and a corresponding one of the gate insulating films of the gate structure, wherein each of the source/drain pattern includes a first semiconductor liners extending along sidewalls and a bottom surface of the source/drain recess, a second semiconductor liner on the first semiconductor liner and extends adjacent to the sidewalls and the bottom surface of the source/drain recesses, and a filling semiconductor film on the second semiconductor liners and is doped with phosphorus, wherein the second semiconductor liners are disposed between the first semiconductor liners and the filling semiconductor film and are doped with carbon, wherein each of the first semiconductor liners include carbon-undoped regions that are in contact with the gate insulating films of the inner gate structures of a corresponding one of the gate structures, wherein a width, in the first direction, of the width-expanded regions increases and then decreases with respect to a direction away from an upper surface of the lower pattern, and wherein a width, in the second direction, of the width-expanded regions reaches its maximum at a location between a corresponding pair of adjacent sheet patterns or between the lower pattern and the sheet pattern adjacent the lower pattern.

According to still another aspect of the present disclosure, a semiconductor device comprises a first active pattern including a first lower pattern and a plurality of first sheet patterns, which are spaced apart from the first lower pattern in a first direction; a second active pattern including a second lower pattern and a plurality of second sheet patterns, which are spaced apart from the second lower pattern in the first direction; a plurality of first gate structures disposed on the first lower pattern and spaced apart from each other in a second direction, each of the first gate structures including a first gate electrode and first gate insulating films; a plurality of second gate structures disposed on the second lower pattern and spaced apart from each other in the second direction, each of the second gate structures including a second gate electrode and second gate insulating films; first source/drain recesses, each defined between a corresponding pair of the first gate structures that are adjacent to each other; second source/drain recesses, each defined between a corresponding pair of the second gate structures that are adjacent to each other; first source/drain patterns, each disposed in a corresponding one of the first source/drain recesses, the first source/drain patterns being in contact with the first gate insulating films and the first lower pattern; and second source/drain patterns, each disposed in a corresponding one the second source/drain recesses, the second source/drain patterns being in contact with the second gate insulating films and the second lower pattern and including p-type impurities, wherein each of the first source/drain patterns includes a first lower semiconductor liner extending along sidewalls and a bottom surface of the first source/drain recess, a first upper semiconductor liner on the first lower semiconductor liner and extending adjacent to the sidewalls and the bottom surface of the first source/drain recess, and a first filling semiconductor film doped with phosphorous and on the first upper semiconductor liner, wherein the first upper semiconductor liners silicon films doped with carbon, wherein the first lower semiconductor liners are in contact with the first lower pattern and the first sheet patterns and include carbon-undoped regions, which extend along the sidewalls and the bottom surface of each of the first source/ drain recesses, and wherein the second source/drain patterns do not include carbon-doped semiconductor liners extending along the sidewalls and the bottom surface of the second source/drain recesses.

It should be noted that the effects of the present invention are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which:

FIGS. 24 through 30 are cross-sectional views illustrating a method of manufacturing a semiconductor device according to some embodiments of the present disclosure.

DETAILED DESCRIPTION

Semiconductor devices according to some embodiments of the present disclosure may include a tunneling field-effect transistor (FET), a three-dimensional (3D) transistor, a two-dimensional (2D) material-based FET, and a heterostructure thereof. Also, semiconductor devices according to some embodiments of the present disclosure may include a bipolar junction transistor, and a laterally-diffused metal-oxide semiconductor (LDMOS) transistor.

A semiconductor device according to some embodiments of the present disclosure will hereinafter be described with reference to FIGS. 1 through 8.

Figure 1:
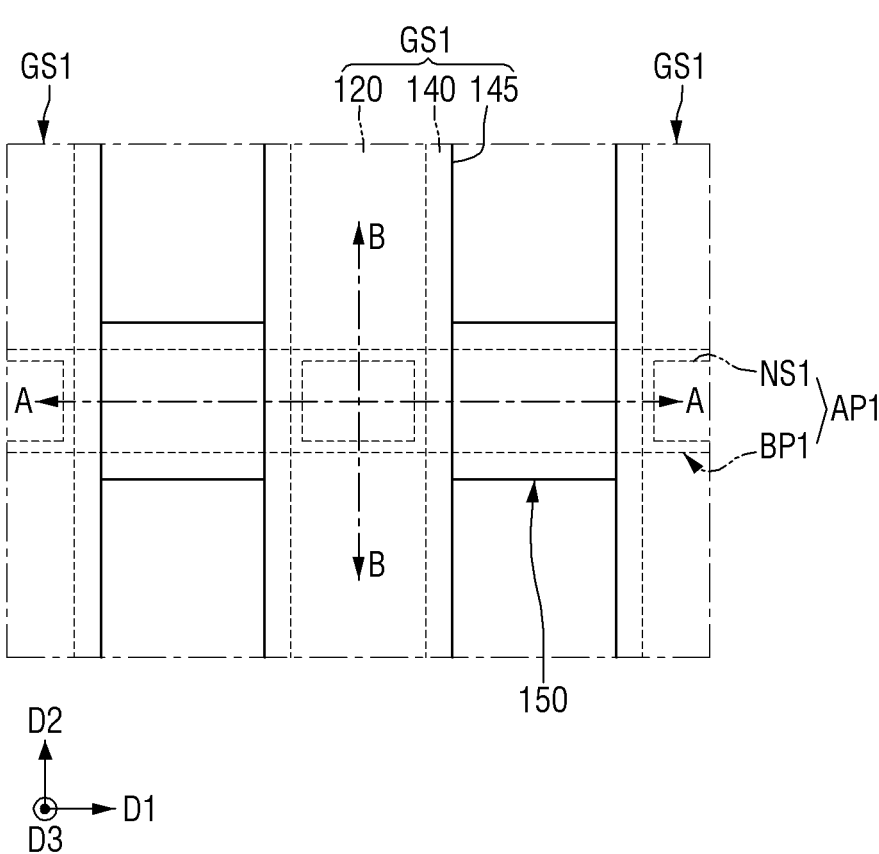
FIG. 1 is a plan view of a semiconductor device according to some embodiments of the present disclosure.
Figure 2:
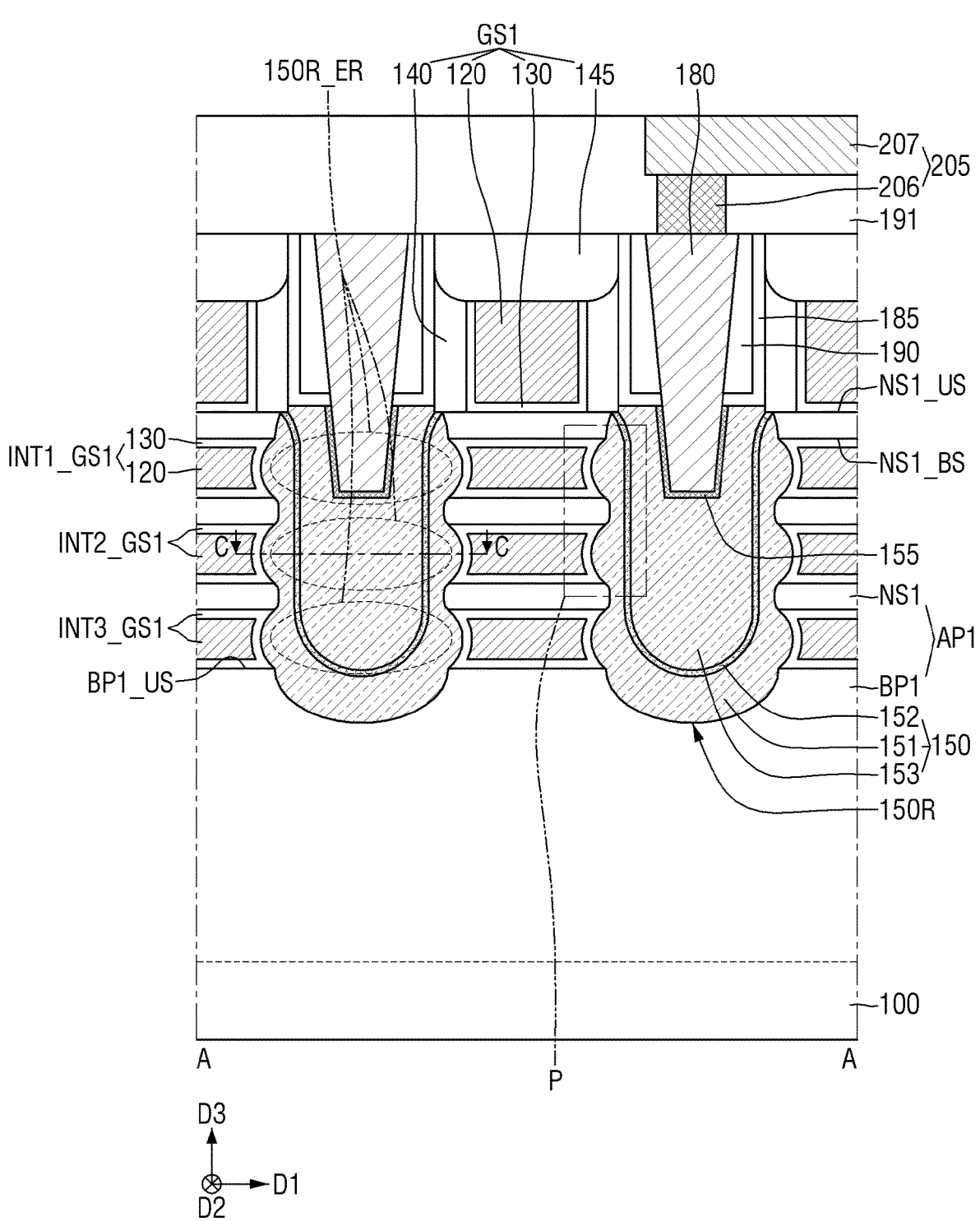
FIGS. 2 and 3 are cross-sectional views taken along lines A-A and B-B of FIG. 1.
Figure 3:
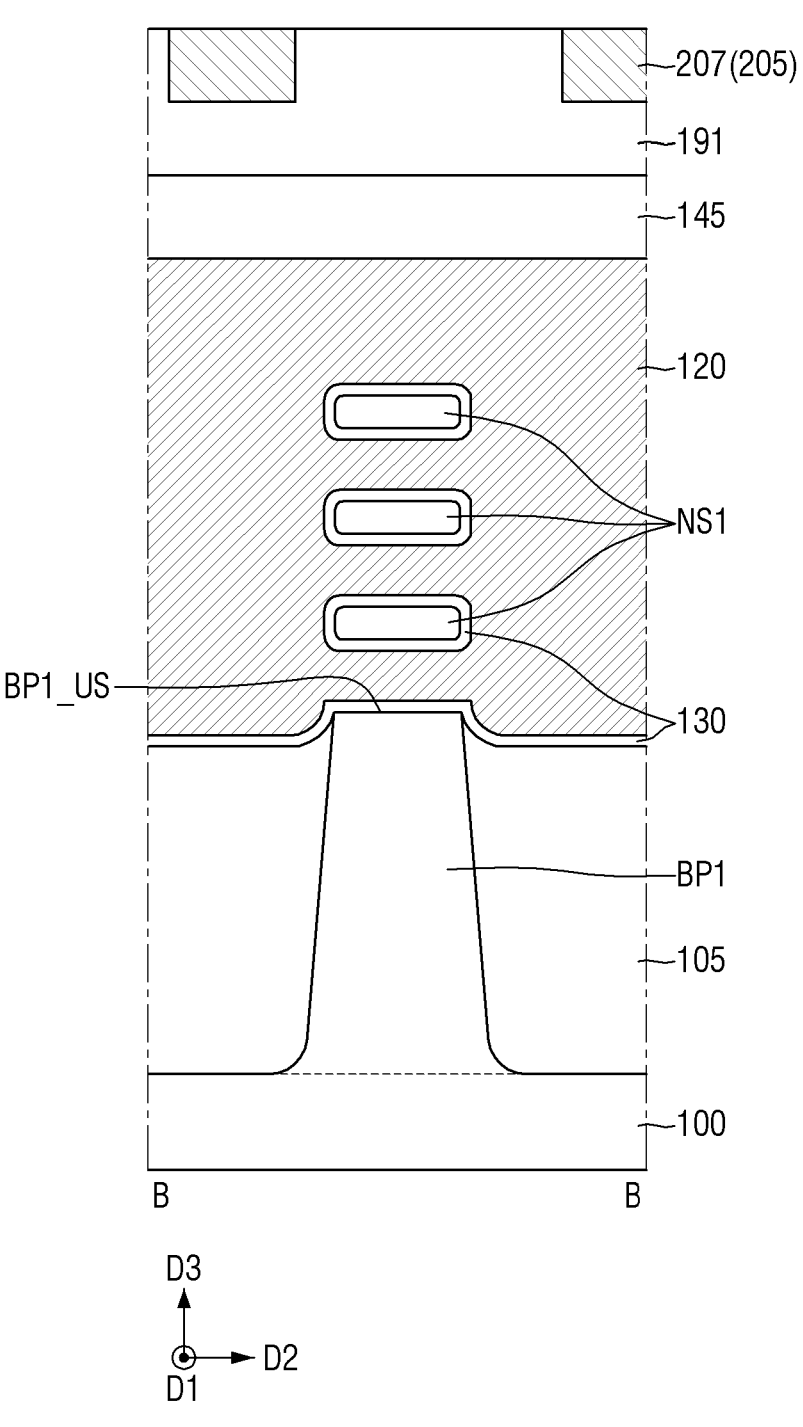
Figure 4:
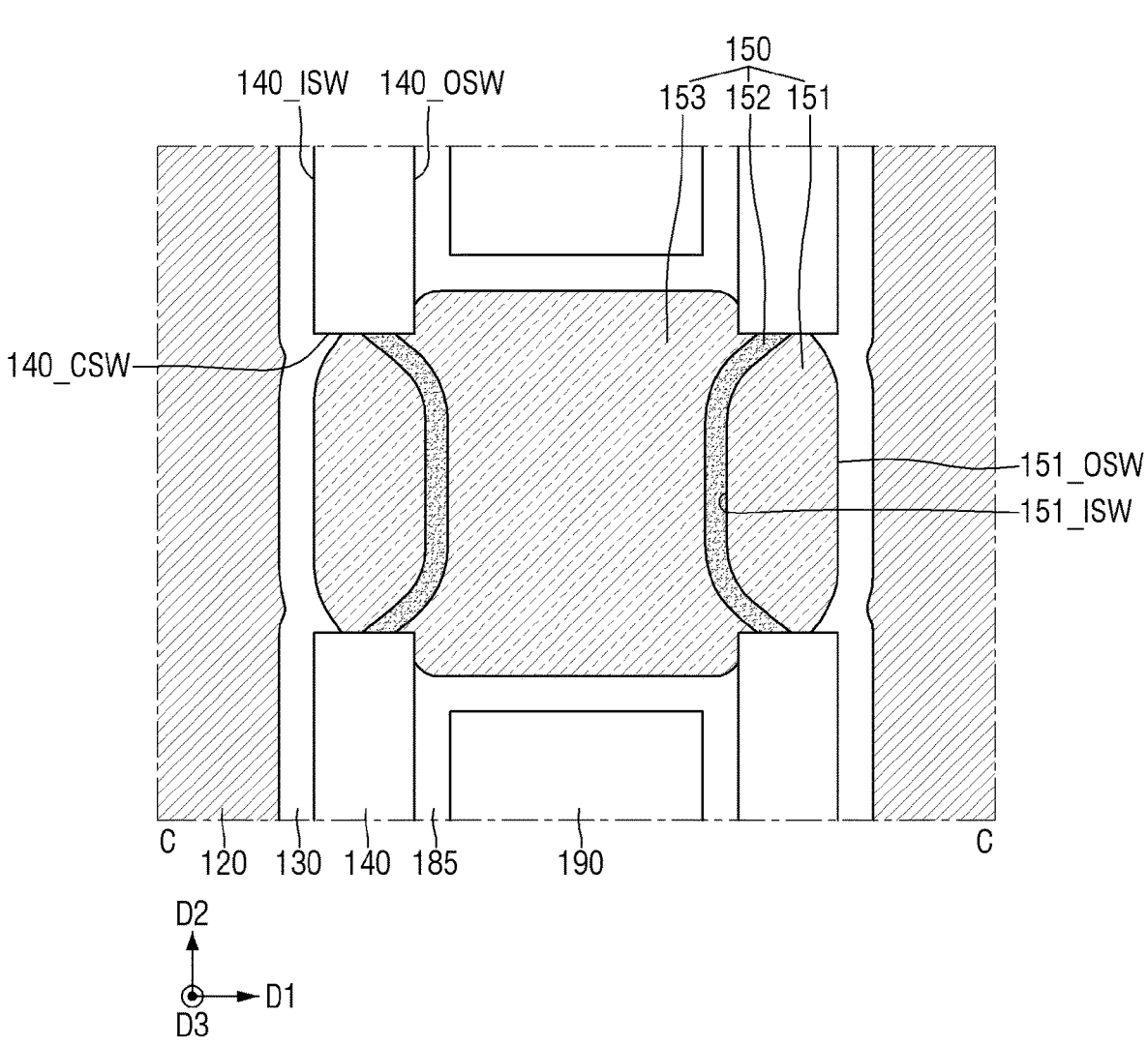
FIG. 4 is a plan view taken along line C-C of FIG. 2.
Figure 5:
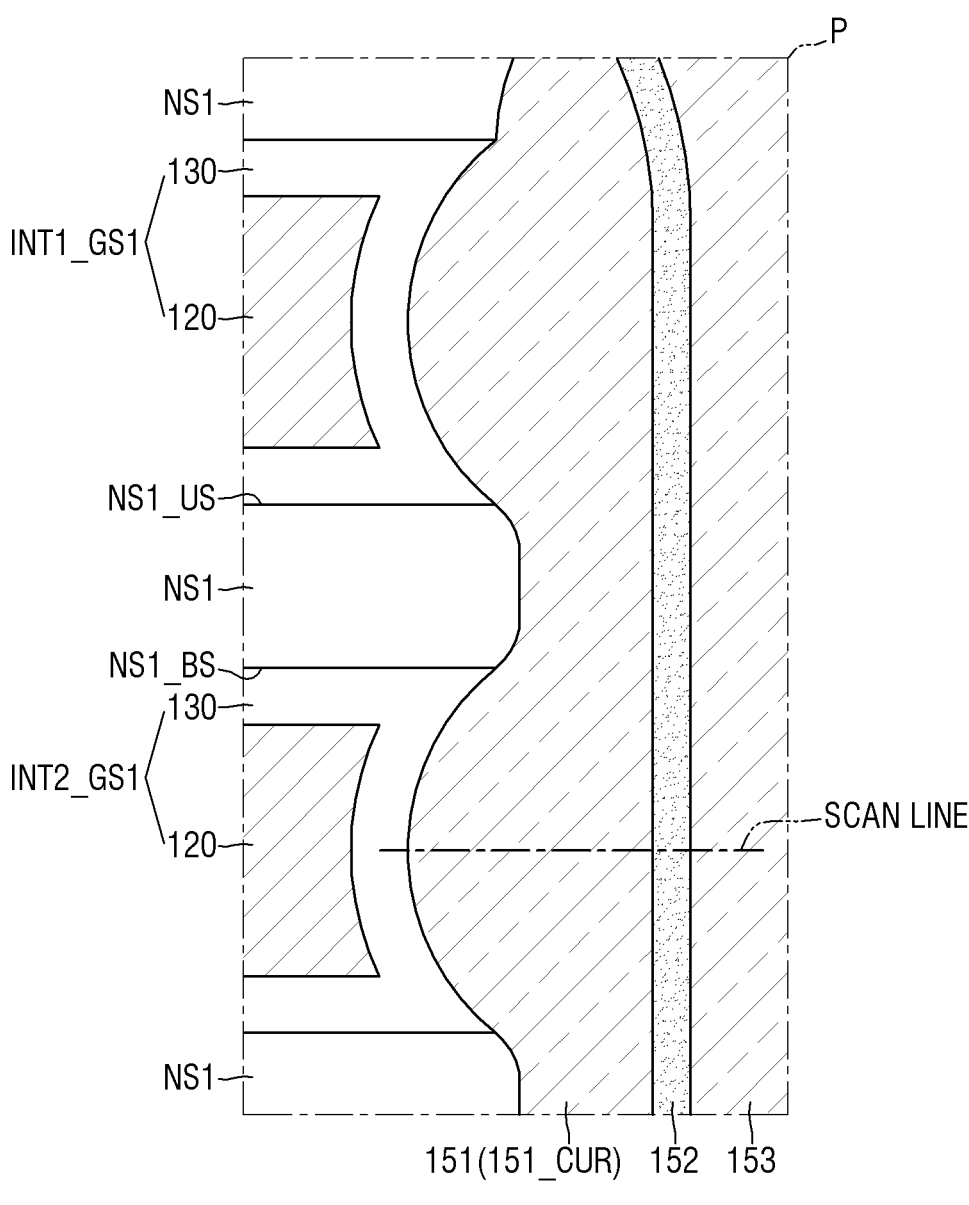
FIG. 5 is an enlarged cross-sectional view of part P of FIG. 2.
Figure 6:
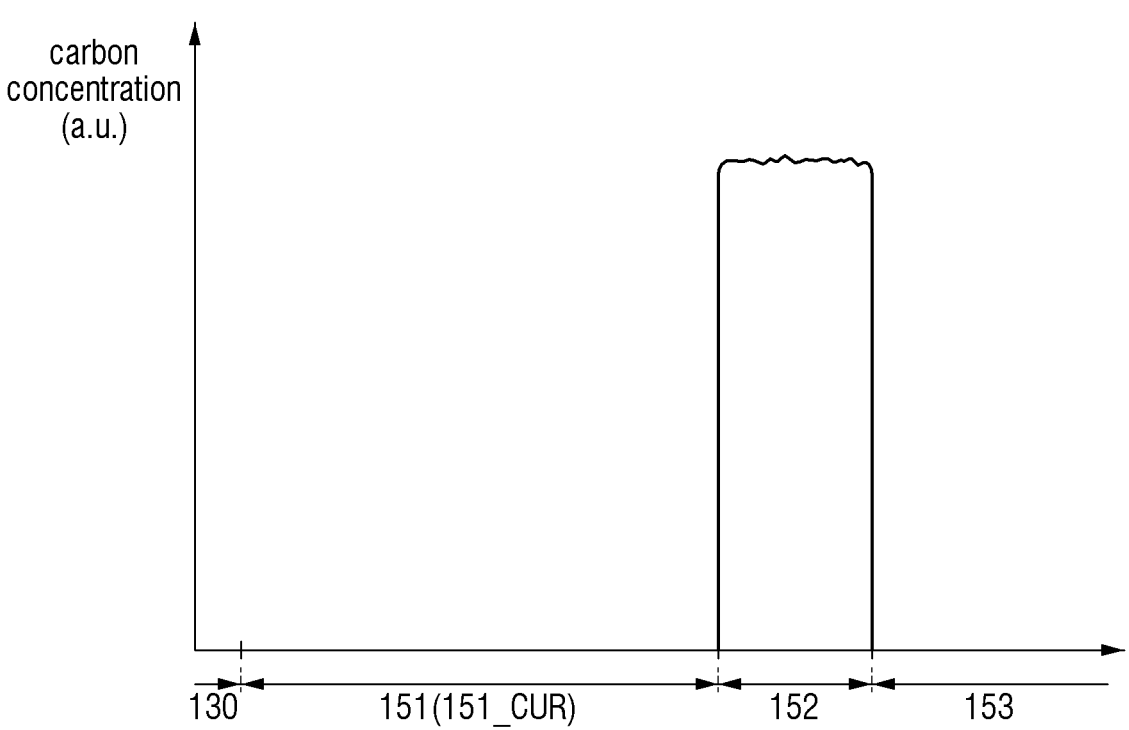
FIG. 6 is a graph showing the concentration of carbon (C) along a scan line "SCAN LINE" of FIG. 5.
Figure 7:
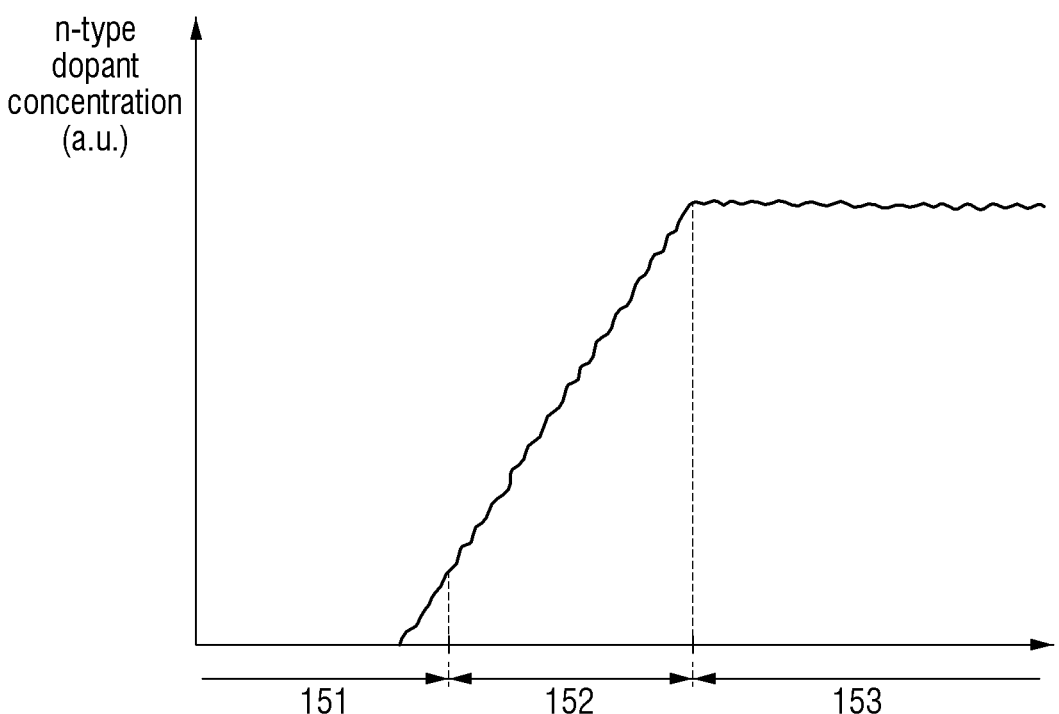
FIGS. 7 and 8 are graphs showing the concentrations of impurities in first source/drain patterns of FIG. 2.
Figure 8:
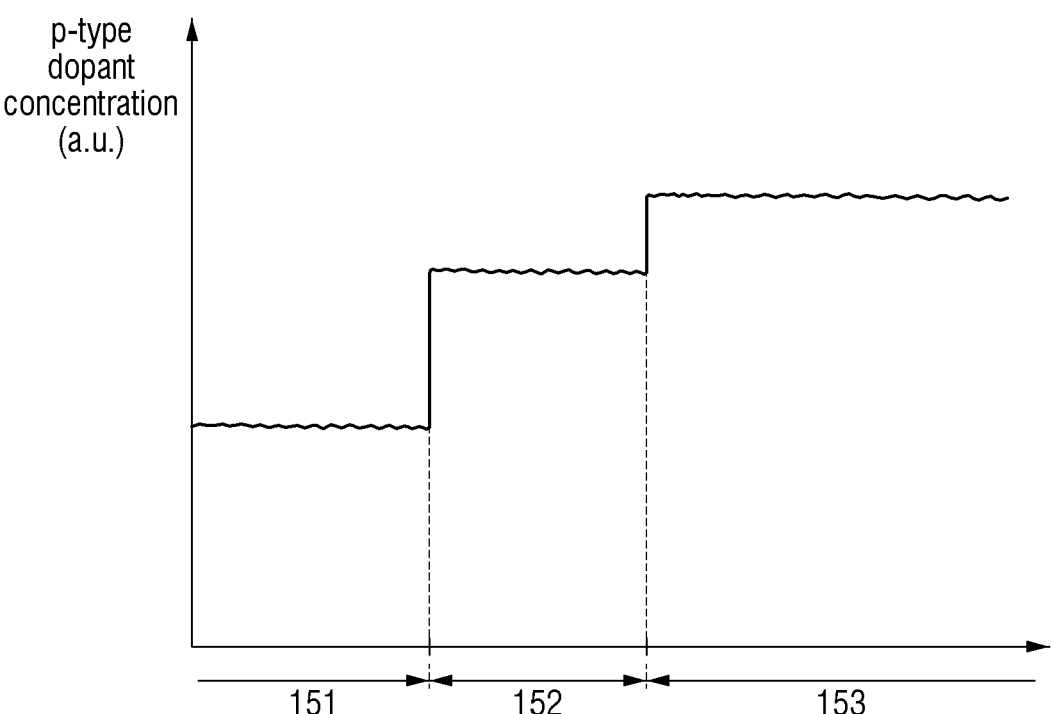

FIG. 1 is a plan view of a semiconductor device according to some embodiments of the present disclosure. The semiconductor devices described herein may be semiconductor chips (e.g., a semiconductor device cut from a wafer) such as a memory chip or memory portion of a system on a chip. FIGS. 2 and 3 are cross-sectional views taken along lines A-A and B-B of FIG. 1. FIG. 4 is a plan view taken along line C-C of FIG. 2. FIG. 5 is an enlarged view of part P of the cross-sectional view of FIG. 2. FIG. 6 is a graph showing the concentration of carbon (C) along a scan line "SCAN LINE" of FIG. 5. FIGS. 7 and 8 are graphs showing the concentrations of impurities in first source/drain patterns of FIG. 2.

For convenience, first gate insulating films 130, source/ drain etch stopper films 185, interlayer insulating films 190, and a wiring 205 are not illustrated in FIG. 1.

Referring to FIGS. 1 through 8, the semiconductor device according to some embodiments of the present disclosure may include a first active pattern AP1, a plurality of first gate electrodes 120, a plurality of first gate structures GS1, and a first source/drain pattern 150.

A substrate 100 may be a semiconductor crystalline substrate, such as a bulk silicon substrate or a silicon-on-insulator (SOI) substrate. The substrate 100 may be a silicon substrate or may include another material such as, for example, silicon-germanium (SiGe), SiGe-on-insulator (SGOI), indium antimonide, a lead tellurium compound, indium arsenide, indium phosphide, gallium arsenide, or gallium antimonide, but the present invention is not limited thereto.

The first active pattern AP1 may be provided with the substrate 100. The first active pattern AP1 may extend in a first direction D1.

For example, the first active pattern AP1 may be disposed in a region where an n-type metal-oxide semiconductor (NMOS) is formed. In another example, the first active pattern AP1 may be disposed in a region where a p-type metal-oxide semiconductor (PMOS) is formed.

The first active pattern AP1 may be, for example, a multi-channel active pattern. The first active pattern AP1 may include a first lower pattern BP1 and a plurality of first sheet patterns NS1.

The first lower pattern BP1 may protrude from an upper surface of the substrate 100 (e.g., a protrusion of the substrate 100 or formed as a separate structure on the substrate 100). The first lower pattern BP1 may extend in the first direction D1.

The first sheet patterns NS1 may be disposed on an upper surface BP1_US of the first lower pattern BP1. The first sheet patterns NS1 may be spaced apart from the first lower pattern BP1 in a third direction D3.

The first sheet patterns NS1 may be spaced apart from one another in the third direction D3.

FIGS. 2 and 3 illustrate that three first sheet patterns NS1 are arranged in the third direction D3, but the present invention is not limited thereto.

The first lower pattern BP1 may be obtained by etching part of the substrate 100 or may include an epitaxial layer grown from the substrate 100. The first lower pattern BP1 may be a semiconductor crystalline material, such as silicon (Si), germanium (Ge), or SiGe. The first lower pattern BP1 may be a compound semiconductor such as, for example, a group IV-IV compound semiconductor or a group III-V compound semiconductor.

The group IV-IV compound semiconductor may be, for example, a binary or ternary compound containing at least two of, Si, Ge, and tin (Sn) or a compound obtained by doping the binary or ternary compound with a group IV element.

The group compound semiconductor may be, for example, a binary, ternary, or quaternary compound obtained by combining at least one of aluminum (Al), gallium (Ga), and indium (In), which are group III elements, and one of phosphorus (P), arsenic (As), and antimony (Sb), which are group V elements.

The first sheet patterns NS1 may be a crystalline semiconductor material such as those described herein with respect to the first lower pattern BP1. For example, the first sheet patterns NS1 may be crystalline Si, Ge, SiGe, the group IV-IV compound semiconductor, or the group compound semiconductor. The first sheet patterns NS1 may be formed of the same material as, or a different material from, the material of the first lower pattern BP1. The first lower pattern BP1 may be a Si lower pattern of or containing Si, and the first sheet patterns NS1 may be Si sheet patterns of or containing Si.

The width, in a second direction D2, of the first sheet patterns NS1 may increase or decrease in proportion to the width, in the second direction D2, of the first lower pattern BP1. For example, the width, in the second direction D2, of the first sheet patterns NS1, which are stacked in the third direction D3, may be uniform, but the present invention is not limited thereto. Alternatively, the width, in the second direction D2, of the first sheet patterns NS1, which are stacked in the third direction D3, may decrease in a direction away from the first lower pattern BP1.

A field insulating film 105 may be formed on the substrate 100. The field insulating film 105 may be disposed on sidewalls of the first lower pattern BP1. The field insulating film 105 may not be disposed on the upper surface BP1_US of the first lower pattern BP1.

For example, the field insulating film 105 may generally cover the sidewalls of the first lower pattern BP1. Alternatively, the field insulating film 105 may cover only lower portions of the sidewalls of the first lower pattern BP1, in which case, part of the first lower pattern BP1 may protrude beyond the upper surface of the field insulating film 105 in the third direction D3.

The first sheet patterns NS1 may be located higher than the upper surface of the field insulating film 105. The field insulating film 105 may be and/or include, for example, an oxide film, a nitride film, an oxynitride film, or a combination thereof. The field insulating film 105 is illustrated as being a single homogenous film, but the present invention is not limited thereto (e.g., the field insulating film 105 may be formed as a stack of several films).

A plurality of first gate structures GS1 may be disposed on the substrate 100. The first gate structures GS1 may extend in the second direction D2. The first gate structures GS1 may be spaced apart from one another in the first direction D1. The first gate structures GS1 may be adjacent to one another in the first direction D1. For example, the first gate structures GS1 may be disposed on both sides of the first source/drain pattern 150. It should also be appreciated that first source/drain patterns 150 may be disposed on both sides of a first gate structure GS1 (as part of a transistor).

The first gate structures GS1 may be disposed on the first active pattern AP1. The first gate structures GS1 may intersect (cross with) the first active pattern AP1.

The first gate structures GS1 may intersect (or cross over) the first lower pattern BP1. With respect to a cross sectional view (see FIG. 3), the first gate structures GS1 may surround each of the first sheet patterns NS1 of a first active pattern AP1.

Each of the first gate structures GS1 may include, for example, a first gate electrode 120, first gate insulating films 130, first gate spacers 140, and a first gate capping pattern 145.

Each of the first gate structures GS1 may include a plurality of inner gate structures (INT1_GS1, INT2_GS1, and INT3_GS1), which are disposed between first sheet patterns NS1 that are adjacent to one another in the third direction D3 or between the first lower pattern BP1 and the first sheet patterns NS1. The lowermost one of the inner gate structures (here, INT3_GS1) may be disposed between the upper surface BP1_US of the first lower pattern BP1 and a bottom surface NS1_BS of a lowermost first sheet pattern NS1. Each of the inner gate structures other than the lowermost inner gate structure (here, INT2_GS1, and INT3_GS1) may be disposed between an upper surface NS1_US and a bottom surface NS1_BS of two adjacent first sheet patterns NS1 that are opposite to each other in the third direction D3.

The number of inner gate structures (INT1_GS1, INT2_GS1, and INT3_GS1) may be proportional to the number of first sheet patterns NS1 included in the first active pattern AP1. For example, the number of inner gate structures (INT1_GS1, INT2_GS1, and INT3_GS1) may be the same as the number of first sheet patterns NS1 included in the first active pattern AP1. As the first active pattern AP1 includes a plurality of first sheet patterns NS1, each of the first gate structures GS1 may include a plurality of inner gate structures (INT1_GS1, INT2_GS1, and INT3_GS1).

The inner gate structures (INT1_GS1, INT2_GS1, and INT3_GS1) may be in contact with the upper surface BP1_US of the first lower pattern BP1, the upper surfaces NS1_US of the first sheet patterns NS1, and the bottom surfaces NS1_BS of the first sheet patterns NS1.

The inner gate structures (INT1_GS1, INT2_GS1, and INT3_GS1) may be in contact with the first source/drain pattern 150.

Each of the first gate structures GS1 will hereinafter be described as including three inner gate structures although it will be appreciated that other numbers of inner gate structures may be provided for a first gate structure GS1. It will also be appreciated that portions of the description below refer to the structure of a single element (e.g., a single first gate structure GS1) but such description should be understood as applicable to all such elements (e.g., applicable to plural first gate structures GS1).

Each of the first gate structures GS1 may include first, second, and third inner gate structures INT1_GS1, INT2_GS1, and INT3_GS1. The first, second, and third inner gate structures INT3_GS1, INT2_GS1, and INT1_GS1 may be sequentially disposed on the first lower pattern BP1.

The third inner gate structure INT3_GS1 may be disposed between the first lower pattern BP1 and a first sheet pattern NS1. The third inner gate structure INT3_GS1 may be disposed at a lowest location, among the inner gate structures (INT1_GS1, INT2_GS1, and INT3_GS1) of each of the first gate structures GS1. The third inner gate structure INT3_GS1 may be the lowermost inner gate structure.

Each of the first and second inner gate structures INT1_GS1 and INT2_GS1 may be disposed between two adjacent first sheet patterns NS1 in the third direction D3. The first inner gate structure INT1_GS1 may be disposed at a highest location, among the inner gate structures (INT1_GS1, INT2_GS1, and INT3_GS1) of each of the first gate structures GS1. The first inner gate structure INT1_GS1 may be the uppermost inner gate structure. The second inner gate structure INT2_GS1 may be disposed between the first and third inner gate structures INT1_GS1 and INT3_GS1.

The inner gate structures (INT1_GS1, INT2_GS1, and INT3_GS1) may include a corresponding portion of the first gate electrode 120 and a first gate insulating film 130 surrounding the same. An inner gate structure (INT1_GS1, INT2_GS1, or INT3_GS1) is disposed between the corresponding adjacent first sheet patterns NS1 or between the first lower pattern BP1 and the first sheet patterns NS1.

In some examples, the width, in the first direction D1, of the first inner gate structure INT1_GS1 may be the same as the width, in the first direction D1, of the second inner gate structure INT1_GS2, and the width, in the first direction D1, of the third inner gate structure INT1_GS3 may be the same as the width, in the first direction D1, of the second inner gate structure INT1_GS2.

In other examples, the width, in the first direction D1, of the third inner gate structure INT1_GS3 may be greater than the width, in the first direction D1, of the second inner gate structure INT1_GS2, and the width, in the first direction D1, of the first inner gate structure INT1_GS1 may be the same as the width, in the first direction D1, of the second inner gate structure INT1_GS2.

The width of an inner gate structure (for example, the second inner gate structure INT1_GS2) may be measured midway between the two adjacent first sheet patterns NS1 that are opposite to each other in the third direction D3 (e.g., midway between an upper surface NS1_US and a bottom surface NS1_BS of two adjacent first sheet patterns NS1).

FIG. 4 illustrates a plan view at the level of the second inner gate structure INT2_GS1. Although not specifically illustrated, plan views at the levels of the first and third inner gate structures INT1_GS1 and INT1_GS3 may be similar to that illustrated in FIG. 4, except for parts where first source/drain contacts 180 are formed.

The first gate electrodes 120 may be formed on the first lower pattern BP1. With respect to a plan view, as shown in FIG. 1, the first gate electrodes 120 may intersect the first lower pattern BP1. Each first gate electrode 120 may surround first sheet patterns NS1 with respect to a cross sectional view.

Referring to a single first gate electrode 120, parts of the first gate electrode 120 may be disposed between every two adjacent first sheet patterns NS1 in the third direction D3. In a case where the first sheet patterns NS1 include lower and upper first sheet patterns NS1 that are adjacent to each other in the third direction D3, part of the first gate electrode 120 may be disposed between an upper surface NS1_US of the lower first sheet pattern NS1 and a bottom surface NS1_BS of the upper first sheet pattern NS1, and part of the first gate electrodes 120 may be disposed between the upper surface BS1_US of the lower first sheet pattern NS1 and a bottom surface of a lowermost first sheet pattern NS1.

The first gate electrodes 120 may be formed of and/or include at least one of a metal, a metal alloy, a conductive metal nitride, a metal silicide, a doped semiconductor material, a conductive metal oxide, and a conductive metal oxynitride. The first gate electrodes 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), Al, copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof, but the present invention is not limited thereto. Here, the conductive metal oxide and the conductive metal oxynitride may include oxides of the aforementioned materials, but the present invention is not limited thereto.

A pair of first gate electrodes 120 may be disposed on both sides of a first source/drain pattern 150 that will be described later. The pair of first gate structures GS1 may be disposed on both sides, in the first direction D1, of the first source/drain pattern 150.

In some examples, a first gate electrode 120 adjacent to a first source/drain pattern 150 may be a normal gate electrode, which is used as the gate of a transistor to operate the transistor (e.g., to switch the transistor to an on (or conductive) or off (non-conductive) state). In some examples, first gate electrodes on both sides of a source/drain pattern 150 may be such normal gate electrodes of corresponding transistors. In another example, first gate electrode 120 on one side of the first source/drain pattern 150 may be a normal gate electrode and used as a gate of a transistor, and a first gate electrode 120 on the other side of the first source/drain pattern 150 may be a dummy gate electrode.

A lowermost one of the first gate insulating films 130 may extend along the upper surface of the field insulating film 105 and the upper surface BP1_US of the first lower pattern BP1. Other ones of the first gate insulating films 130 may surround a corresponding one of the first sheet patterns NS1 with respect to a cross section (e.g., see FIG. 3). The first gate insulating films 130 may be disposed along the circumferences of the first sheet patterns NS1. Portions of the first gate electrode 120 may be disposed on the first gate insulating films 130. The first gate insulating films 130 may be disposed between portions of the first gate electrode 120 and the first sheet pattern NS1. Parts of the first gate insulating films 130 may be disposed between first sheet patterns NS1 that are adjacent to one another in the third direction D3 or between the first lower pattern BP1 and the first sheet patterns NS1.

The first gate insulating films 130 may be formed of and/or include silicon oxide, silicon oxynitride, silicon nitride, or a high-k material having a greater dielectric constant than silicon oxide. The high-k material may include, for example, one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first gate insulating films 130 are illustrated as being single homogenous films, but the present invention is not limited thereto. Each of the first gate insulating films 130 may include a plurality of films. The first gate insulating films 130 may include interfacial films, which are disposed between the first sheet patterns NS1 and the first gate electrodes 120, and high-k insulating films.

The semiconductor device according to some embodiments of the present disclosure may include negative capacitance (NC) FETs using negative capacitors. For example, the first gate insulating films 130 may include ferroelectric material films having ferroelectric properties and paraelectric material films having paraelectric properties.

The ferroelectric material films may have a negative capacitance, and the paraelectric material films may have a positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of (and/or at least one of) the two or more capacitors.

If the ferroelectric material films having a negative capacitance and the paraelectric material films having a positive capacitance are connected in series, the total capacitance of the ferroelectric material films and the paraelectric material films may increase. Accordingly, transistors having the ferroelectric material films can have a sub-threshold swing (SS) of less than 60 mV/decade at room temperature.

The ferroelectric material films may have ferroelectric properties. The ferroelectric material films may be formed of and/or include, for example, at least one of hafnium oxide, hafnium zirconium oxide, barium strontium titanium oxide, barium titanium oxide, and lead zirconium titanium oxide. In some examples, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material films may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and tin (Sn). The type of dopant may vary depending on the type of material of the ferroelectric material films.

If the ferroelectric material films include hafnium oxide, the dopant of the ferroelectric material films may include, for example, at least one of Gd, Si, Zr, Al, and Y.

If the dopant of the ferroelectric material films is Al, the ferroelectric material films may include 3 atomic % (at %) to 8 at % of Al. Here, the ratio of the dopant in the ferroelectric material films may refer to the ratio of the sum of the amounts of Hf and Al to the amount of Al in the ferroelectric material films.

If the dopant of the ferroelectric material films is Si, the ferroelectric material films may include 2 at % to 10 at % of Si. If the dopant of the ferroelectric material films is Y, the ferroelectric material films may include 2 at % to 10 at % of Y. If the dopant of the ferroelectric material films is Gd, the ferroelectric material films may include 1 at % to 7 at % of Gd. If the dopant of the ferroelectric material films is Zr, the ferroelectric material films may include 50 at % to 80 at % of Zr.

The paraelectric material films may include paraelectric properties. The paraelectric material films may be formed of and/or include, for example, at least one of silicon oxide and a high-k metal oxide. The high-k metal oxide may be and/or formed of include, for example, at least one of hafnium oxide, zirconium oxide, and aluminum oxide, but the present invention is not limited thereto.

The ferroelectric material films and the paraelectric material films may be formed of and/or include the same material. The ferroelectric material films may have ferroelectric properties, but the paraelectric material films may not have ferroelectric properties. For example, if the ferroelectric material films and the paraelectric material films include hafnium oxide, the hafnium oxide included in the ferroelectric material films may have a different crystalline structure from the hafnium oxide included in the paraelectric material films.

The ferroelectric material films may be thick enough to exhibit ferroelectric properties. The ferroelectric material films may have a thickness of, for example, 0.5 nm to 10 nm, but the present invention is not limited thereto. A critical thickness that can exhibit ferroelectric properties may vary depending on the type of ferroelectric material, and thus, the thickness of the ferroelectric material films may vary depending on the type of ferroelectric material included in the ferroelectric material films.

For example, each of the first gate insulating films 130 may include only one ferroelectric material film. In another example, each of the first gate insulating films 130 may include a plurality of ferroelectric material films that are spaced apart from one another. Each of the first gate insulating films 130 may have a structure in which a plurality of ferroelectric material films and a plurality of paraelectric material films are alternately stacked.

The first gate spacers 140 may be disposed on sidewalls of the first gate electrode 120. The first gate spacers 140 may not be disposed between the first lower pattern BP1 and first sheet patterns NS1 that are adjacent to one another in the third direction D3 and between the first sheet patterns NS1.

As shown in FIG. 4, the first gate spacers 140 may include inner sidewalls 140_ISW, connecting sidewalls 140_CSW, and outer sidewalls 140_OSW. The inner sidewall 140_ISW of the first gate spacers 140 may face a corresponding sidewall of a first gate electrode 120 that extends in the second direction D2. The inner sidewalls 140_ISW of the first gate spacers 140 may extend in the second direction D2 (e.g., extend along a corresponding sidewall of a first gate electrode 120). The inner sidewalls 140_ISW of the first gate spacers 140 may be opposite to the outer sidewalls 140_OSW of the first gate spacers 140 that face the interlayer insulating films 190. The connecting sidewalls 140_CSW of the first gate spacers 140 may connect the inner sidewalls 140_ISW of the first gate spacers 140 and the outer sidewalls 140_OSW of the first gate spacers 140. The connecting sidewalls 140_CSW of the first gate spacers 140 may extend in the first direction D1.

The first gate insulating films 130 may extend along the inner sidewalls 140_ISW of the first gate spacers 140. The first gate insulating films 130 may be interposed between in contact with a corresponding inner sidewall 140_ISW of a first gate spacers 140 and a corresponding first gate spacer 140).

The first gate spacers 140 may be formed of and/or include at least one of, for example, silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and a combination thereof. The first gate spacers 140 are illustrated as being a single homogenous film, but the present invention is not limited thereto.

The first gate capping patterns 145 may be disposed on the first gate electrodes 120 and the first gate spacers 140. The upper surfaces of the first gate capping patterns 145 may be on the same plane as the upper surfaces of the interlayer insulating films 190. Alternatively, the first gate capping patterns 145 may be disposed between the first gate spacers 140.

The first gate capping patterns 145 may be formed of and/or include at least one of, for example, SiN, SiON, SiCN, SiOCN, and a combination thereof. The first gate capping patterns 145 may include a material having an etching selectivity with respect to the interlayer insulating films 190.

The first source/drain pattern 150 may be disposed on the first active pattern AP1. The first source/drain pattern 150 may be disposed on and contact the first lower pattern BP1. The first source/drain pattern 150 may be connected to the first sheet patterns NS1. The first source/drain pattern 150 may be in contact with the first sheet patterns NS1.

As illustrated in FIG. 2, a first source/drain pattern 150 may be disposed on sides of adjacent first gate structures GS1. The first source/drain pattern 150 may be disposed between the first gate structures GS1, which are adjacent to each other in the first direction D1. For example, the first source/drain pattern 150 may be disposed on facing sides of adjacent first gate structures GS1. Alternatively, the first source/drain pattern 150 may be disposed on one side of only one of the first gate structures GS1.

The first source/drain patterns 150 may form the sources/drains of transistors that use the first sheet patterns NS1 as channel regions.

The first source/drain patterns 150 may be disposed in corresponding first source/drain recesses 150R. Each first source/drain pattern 150 may fill a first source/drain recess 150R.

The first source/drain recesses 150R may extend in the third direction D3. The first source/drain recesses 150R may be defined between the first gate structures GS1, which are adjacent to each other in the first direction D1.

The bottom surfaces of the first source/drain recesses 150R are defined by the first lower pattern BP1. The sidewalls of each of the first source/drain recesses 150R may be defined by the first sheet patterns NS1 and the inner gate structures (INT1_GS1, INT2_GS1, and INT3_GS1). The inner gate structures (INT1_GS1, INT2_GS1, and INT3_GS1) may define parts of the sidewalls of each of the first source/drain recesses 150R. Referring to FIG. 4, the first source/drain recess 150R is defined by the connecting sidewalls 140_CSW of the first gate spacers 140.

The inner gate structures (INT1_GS1, INT2_GS1, and INT3_GS1) may have upper surfaces that face the bottom surfaces NS1_BS of the first sheet patterns NS1. The inner gate structures (INT1_GS1, INT2_GS1, and INT3_GS1) may have bottom surfaces that faces the upper surfaces NS1_US of the first sheet patterns NS1 or the upper surface BP1_US of the first lower pattern BP1. The inner gate structures (INT1_GS1, INT2_GS1, and INT3_GS1) may include sets of sidewalls that connect the upper surfaces and the bottom surfaces of the inner gate structures (INT1_GS1, INT2_GS1, and INT3_GS1). The sidewalls of each of the inner gate structures (INT1_GS1, INT2_GS1, and INT3_GS1) may define parts of the sidewalls of each of the first source/drain recesses 150R.

The boundaries between the first gate insulating films 130 and the first lower pattern BP1 may correspond to the upper surface BP1_US of the first lower pattern BP1, between the first lower pattern BP1 and lowermost first sheet patterns NS1. The upper surface BP1_US of the first lower pattern BP1 may correspond to the boundaries between the first lower pattern BP1 and third inner gate structures INT3_GS1. The bottom surfaces of the first source/drain recesses 150R may be lower than the upper surface BP1_US of the first lower pattern BP1.

Referring to FIG. 2, each of the first source/drain recesses 150R may have wavy sidewalls (e.g., sidewalls having a series of convex protrusions arranged in the third direction D3 forming indented portions (e.g., concave portions) of the sidewalls therebetween). Each of the first source/drain recesses 150R may include a plurality of width-expanded regions 150R_ER. The width-expanded regions 150R_ER may be defined above the upper surface BP1_US of the first lower pattern BP1.

Each of the width-expanded regions 150R_ER may be vertically positioned (in the D3 direction) between a corresponding pair of first sheet patterns NS1 that are adjacent to each other in the third direction D3. The lowermost one of the width-expanded regions 150R_ER may be vertically positioned between the first lower pattern BP1 and the first sheet patterns NS1. Each of the width-expanded regions 150R_ER may vertically extend between two adjacent first sheet patterns NS1 in the third direction D3. Each of the width-expanded regions 150R_ER may be extend between a corresponding pair of inner gate structures that are adjacent to each other in the first direction D1.

Each of the width-expanded regions 150R_ER may include a portion whose width in the first direction D1 increases away from the upper surface BP1_US of the first lower pattern BP1 and a portion whose width in the first direction D1 decreases away from the upper surface BP1_US of the first lower pattern BP1. For example, the width of the width-expanded regions 150R_ER may increase and then decrease with respect to a direction away from the upper surface BP1_US of the first lower pattern BP1.

Points where the width of the width-expanded regions 150R_ER reaches its maximum may be located in the vertical (D3) direction between the first lower pattern BP1 and the first sheet patterns NS1 and between first sheet patterns NS1 that are adjacent to one another in the third direction D3.

The first source/drain pattern 150 may be in contact with the first sheet patterns NS1 and the first lower pattern BP1. Parts of the first source/drain pattern 150 may be in contact with the connecting sidewalls 140_CSW of the first gate spacers 140. The first gate insulating films 130 of the inner gate structures (INT1_GS1, INT2_GS1, and INT3_GS1) may be in contact with the first source/drain pattern 150.

The first source/drain patterns 150 may include first lower semiconductor liners 151, first upper semiconductor liners 152, and a first filling semiconductor film 153.

The first lower semiconductor liner 151 may be continuously formed along the surface of (i.e., defining) the first source/drain recesses 150R. The first lower semiconductor liner 151 may extend along the sidewalls and the bottom surface of the first source/drain recess 150R. First lower semiconductor liners 151 may have a U-shape with respect to a cross section view (e.g., see FIG. 2).

The first lower semiconductor liner 151 may be in contact with the first sheet patterns NS1, the first lower pattern BP1, and the first gate insulating films 130 of the inner gate structures (INT1_GS1, INT2_GS1, and INT3_GS1).

The first lower semiconductor liner 151 may include outer sidewalls 151_OSW and inner sidewalls 151_ISW. The outer sidewalls 151_OSW of the first lower semiconductor liners 151 may be in contact with the first gate insulating films 130, the first sheet patterns NS1, and the first lower pattern BP1. The outer sidewalls 151_OSW of the first lower semiconductor liner 151 may be in contact with the inner gate structures (INT1_GS1, INT2_GS1, and INT3_GS1). The outer sidewalls 151_OSW of the first lower semiconductor liners 151 may exhibit the profile of the first source/drain recesses 150R with respect to a cross sectional view.

The inner sidewalls 151_ISW of the first lower semiconductor liners 151 may be opposite to the outer sidewalls 151_OSW of the first lower semiconductor liners 151. The first lower semiconductor liner 151 may include portions whose width in the second direction D2 decrease with respect to a direction away from the outer sidewalls 151_OSW of the first lower semiconductor liners 151. The inner sidewalls 151_ISW of the first lower semiconductor liner 151 may include facet portions and connecting portions. The facet portions of the inner sidewalls 151_ISW of the first lower semiconductor liner 151 may extend from the connecting sidewalls 140_CSW of the first gate spacers 140. The connecting portions of the inner sidewalls 151_ISW of the first lower semiconductor liner 151 may extend in the second direction D2.

For example, the first lower semiconductor liner 151 may include liner portions and protruding portions. Referring to FIG. 5, the liner portions of the first lower semiconductor liners 151 may be divided from the protruding portions of the first lower semiconductor liners 151 along a line connecting ends of first sheet patterns NS1 that are stacked in the third direction D1.

The liner portions of the first lower semiconductor liner 151 may extend along the sidewalls and the bottom surface of each of the first source/drain recesses 150R. The protruding portions of the first lower semiconductor liner 151 may protrude from the liner portions of the first lower semiconductor liner 151 in the first direction D1. The protruding portions of the first lower semiconductor liners 151 may protrude toward the inner gate structures (INT1_GS1, INT2_GS1, and INT3_GS1). The protruding portions of the first lower semiconductor liner 151 may be in contact with the first gate insulating films 130 of the inner gate structures (INT1_GS1, INT2_GS1, and INT3_GS1).

The first upper semiconductor liners 152 are disposed on corresponding first lower semiconductor liners 151. The first upper semiconductor liners 152 may extend along the sidewalls and the bottom surface of each of the first source/drain recesses 150R. The first upper semiconductor liners 152 may be formed along the profile of the first lower semiconductor liners 151.

The first upper semiconductor liners 152 may be disposed on the inner sidewalls 151_ISW of the first lower semiconductor liners 151. For example, the first upper semiconductor liners 152 may be in contact with the inner sidewalls 151_ISW of the first lower semiconductor liners 151.

The first upper semiconductor liners 152 may cover the entire inner sidewalls 151_ISW of the first lower semiconductor liners 151. The first upper semiconductor liners 152 may cover the facet portions and the connecting portions of the inner sidewalls 151_ISW of the first lower semiconductor liners 151. The first upper semiconductor liners 152 may be in contact with the connecting sidewalls 140_CSW of the first gate spacers 140.

The first filling semiconductor film 153 is disposed on the first upper semiconductor liners 152. The first filling semiconductor film 153 may fill the first source/drain recesses 150R. For example, the first filling semiconductor film 153 may be in contact with the first upper semiconductor liners 152.

The first lower semiconductor liners 151 may be formed of and/or include, for example, Si or SiGe. The first lower semiconductor liners 151 may be a crystalline semiconductor material, such as epitaxial semiconductor films. The first lower semiconductor liners 151 may be and/or include Si films or SiGe films.

The first upper semiconductor liners 152 may be and/or include, for example, Si or SiGe. The first upper semiconductor liners 152 may be a crystalline semiconductor material, such as epitaxial semiconductor films. The first upper semiconductor liners 152 may be and/or include Si films or SiGe films.

In a case where the first lower semiconductor liners 151 are SiGe, the Ge fraction of the first lower semiconductor liners 151 may be less than 10%. Also, in a case where the first upper semiconductor liner 152 are SiGe, the Ge fraction of the first upper semiconductor liners 152 may be less than 10%.

The first upper semiconductor liners 152 may be doped with carbon (C). The first upper semiconductor liners 152 may be epitaxial semiconductor layers doped with C. In a case where the first upper semiconductor liners 152 include Si films, the first upper semiconductor liners 152 may be Si films doped with C. In a case where the first upper semiconductor liners 152 include SiGe films, the first upper semiconductor liners 152 may be SiGe films doped with C. Less than 0.5 at % of C may be included in the first upper semiconductor liners 152, but the present invention is not limited thereto. In some examples, the C concentration of the first upper semiconductor liners 152 may be less than 2.5 E20 ($2.5 \times 10^{20}$) (/cm$^3$).

In a case where the first upper semiconductor liners 152 are doped with C, the resistance of the first upper semiconductor liners 152 against etching can be improved as compared to semiconductor films that are not doped with C. For example, referring to FIG. 30, the first upper semiconductor liners 152 may not be etched while first sheet patterns NS1 are being formed by removing sacrificial patterns SC_L. As the first upper semiconductor liners 152 cover the facet portions of the inner sidewalls 151_ISW of the first lower semiconductor liners 151, the penetration of an etchant for removing the sacrificial patterns SC_L, through the connecting sidewalls 140_CSW of the first gate spacers 140, can be prevented. The first upper semiconductor liners 152 can prevent the first filling semiconductor film 153 from being etched by the etchant. The etchant may be a gas or a liquid.

The first lower semiconductor liners 151 may form C-undoped regions 151_CUR. The C-undoped regions 151_CUR may be in contact with the first gate insulating films 130 of the inner gate structures (INT1_GS1, INT2_GS1, and INT3_GS1).

The first lower semiconductor liners 151 may not be doped with C and may not include C. Referring to FIGS. 5 and 6, the entire first lower semiconductor liners 151 may form the C-undoped regions 151_CUR. The C-undoped regions 151_CUR may be a crystalline semiconductor material, such as epitaxial semiconductor films that are not doped with C. As illustrated in FIG. 6, some of the C doped into the first upper semiconductor liners 152 may diffuse into the first filling semiconductor film 153.

In a case where the first source/drain pattern 150 is an NMOS source/drain (i.e., the source/drain of an NMOS transistor), the first filling semiconductor film 153 may be doped with a first n-type impurities (a charge carrier impurity). For example, the first filling semiconductor film 153 may be Si doped with a first n-type impurities. The first n-type impurities may be, for example, P (phosphorus), As (arsenic), Sb (antimony) and Bi (bismuth).

In some examples, n-type impurities may not be provided during the formation of the first lower semiconductor liners 151 and the first upper semiconductor liners 152 (e.g., no charge carrier impurities may be provided (directly or otherwise) to first lower semiconductor liners 151 and the first upper semiconductor liners 152 prior to the formation of first filling semiconductor film 153). Referring to FIG. 7, after formation of the first filling semiconductor film 153, the first n-type impurities included in the first filling semiconductor film 153 may diffuse into the first lower semiconductor liners 151 and the first upper semiconductor liners 152. The concentration of n-type impurities may gradually decrease with respect to a distance away from the first filling semiconductor film 153.

Alternatively, the first upper semiconductor liners 152 may include the diffused n-type impurities, but the first lower semiconductor liners 151 may not include the diffused n-type impurities.

In another example, the n-type impurities may not be provided during the formation of the first lower semiconductor liners 151, but may be provided with the formation of the first upper semiconductor liners 152. The n-type impurities may include at least one of P, As, Sb, and bismuth (Bi). In this example, the concentration of n-type impurities in the first upper semiconductor liners 152 may not gradually decrease away from the first filling semiconductor film 153.

In a case where the first source/drain pattern 150 is included in a PMOS source/drain, the first filling semiconductor film 153 may be epitaxial SiGe doped with p-type impurities. For example, the p-type impurities may be B, but the present invention is not limited thereto. The Ge fraction of the first filling semiconductor film 153 may be greater than the Ge fractions of the first lower semiconductor liner 151 and the first upper semiconductor liners 152.

For example, the p-type impurities may be provided during the formation of the first lower semiconductor liners 151 and the first upper semiconductor liners 152 (e.g., prior to forming the first filling semiconductor film 153). The first lower semiconductor liners 151 and the first upper semiconductor liners 152 may include doped B. The concentration of p-type impurities in the first lower semiconductor liners 151 may differ from the concentration of p-type impurities in the first upper semiconductor liners 152 and the concentration of p-type impurities in the first filling semiconductor film 153, but the present invention is not limited thereto. The concentration of p-type impurities in the first upper semiconductor liners 152 may differ from the concentration of p-type impurities in the first filling semiconductor film 153, but the present invention is not limited thereto.

In another example, the p-type impurities may be provided during the formation of the first lower semiconductor liners 151, but not during the formation of the first upper semiconductor liners 152 (which may be formed undoped of charge carrier dopants).

The source/drain etch stopper films 185 may extend along the profiles of the outer sidewalls 140_OSW Of the first gate spacers 140 and the first source/drain pattern 150. Although not specifically illustrated, the source/drain etch stopper films 185 may be disposed on the upper surface of the field insulating film 105.

The source/drain etch stopper films 185 may include a material having an etching selectivity with respect to the first interlayer insulating films 190. The source/drain etch stopper films 185 may be and/or include at least one of, for example, SiN, SiON, SiOCN, SiBN, SiOBN, SiOC, and a combination thereof.

The first interlayer insulating films 190 may be disposed on the source/drain etch stopper films 185. The first interlayer insulating films 190 may be disposed on the first source/drain pattern 150. The first interlayer insulating films 190 may not cover the upper surfaces of the first gate capping patterns 145. For example, the upper surfaces of the first interlayer insulating films 190 may be on the same plane as the upper surfaces of the first gate capping patterns 145.

The first interlayer insulating films 190 may be and/or include at least one of, for example, silicon oxide, silicon nitride, silicon oxynitride, and a low-k material. The low-k material may include, for example, fluorinated tetraethyl orthosilicate (FTEOS), hydrogen silsesquioxane (HSQ), bis-benzocycloutene (BCB), tetramethyl orthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazen (TOSZ), fluoride silicate glass (FSG), polyimide nanofoam (such as polypropylene oxide), carbon doped silicon oxide (CDO), organo silicate glass (OSG), SiLK, amorphous fluorinated carbon, silica aerogel, silica xerogel, mesoporous silica, and a combination thereof, but the present invention is not limited thereto.

The first source/drain contacts 180 are disposed on the first source/drain pattern 150. The first source/drain contacts 180 are connected to the first source/drain pattern 150. The first source/drain contacts 180 may be connected to the first source/drain pattern 150 through the first interlayer insulating films 190 and the source/drain etch stopper films 185.

First metal silicide films 155 may be further disposed between the first source/drain contacts 180 and the first source/drain pattern 150.

The first source/drain contacts 180 are illustrated as being single homogenous film, but the present invention is not limited thereto. The first source/drain contacts 180 may be formed of one or more of, for example, a metal, a metal alloy, a conductive metal nitride, a conductive metal carbide, a conductive metal oxide, a conductive metal carbonitride, and a two-dimensional (2D) material.

The first metal silicide films 155 may be formed of a metal silicide.

A second interlayer insulating film 191 is disposed on the first interlayer insulating films 190. The second interlayer insulating film 191 may be formed of one or more of, for example, silicon oxide, silicon nitride, silicon oxynitride, and a low-k material.

The wiring 205 (a conductive wire formed of one or more conductors) is disposed in the second interlayer insulating film 191. The wiring 205 may be connected to the first source/drain contacts 180. The wiring 205 may include a wiring line 207 and a wiring via 206.

In some examples, the wiring via 206 may be formed in one deposition process (e.g., a first damascene process), and then, the wiring line 207 may be formed in a second deposition process (e.g., a second damascene process). In some examples, the wiring via 206 and wiring line 207 may be formed of different materials from one another. In other examples, the wiring via 206 and the wiring line 207 may be formed at the same time (e.g., in a single deposition process and formed of the same material).

The wiring line 207 and the wiring via 206 may are each illustrated as being single homogenous film, but the present invention is not limited thereto. The wiring line 207 and the wiring via 206 may be formed of one or more of, for example, a metal, a metal alloy, a conductive metal nitride, a conductive metal carbide, a conductive metal oxide, a conductive metal carbonitride, and a 2D material.

For example, the upper surface of a first source/drain contact 180 connected to the wiring 205 may be on the same plane as the upper surface of a first source/drain contact 180 not connected to the wiring 205.

Figure 9:
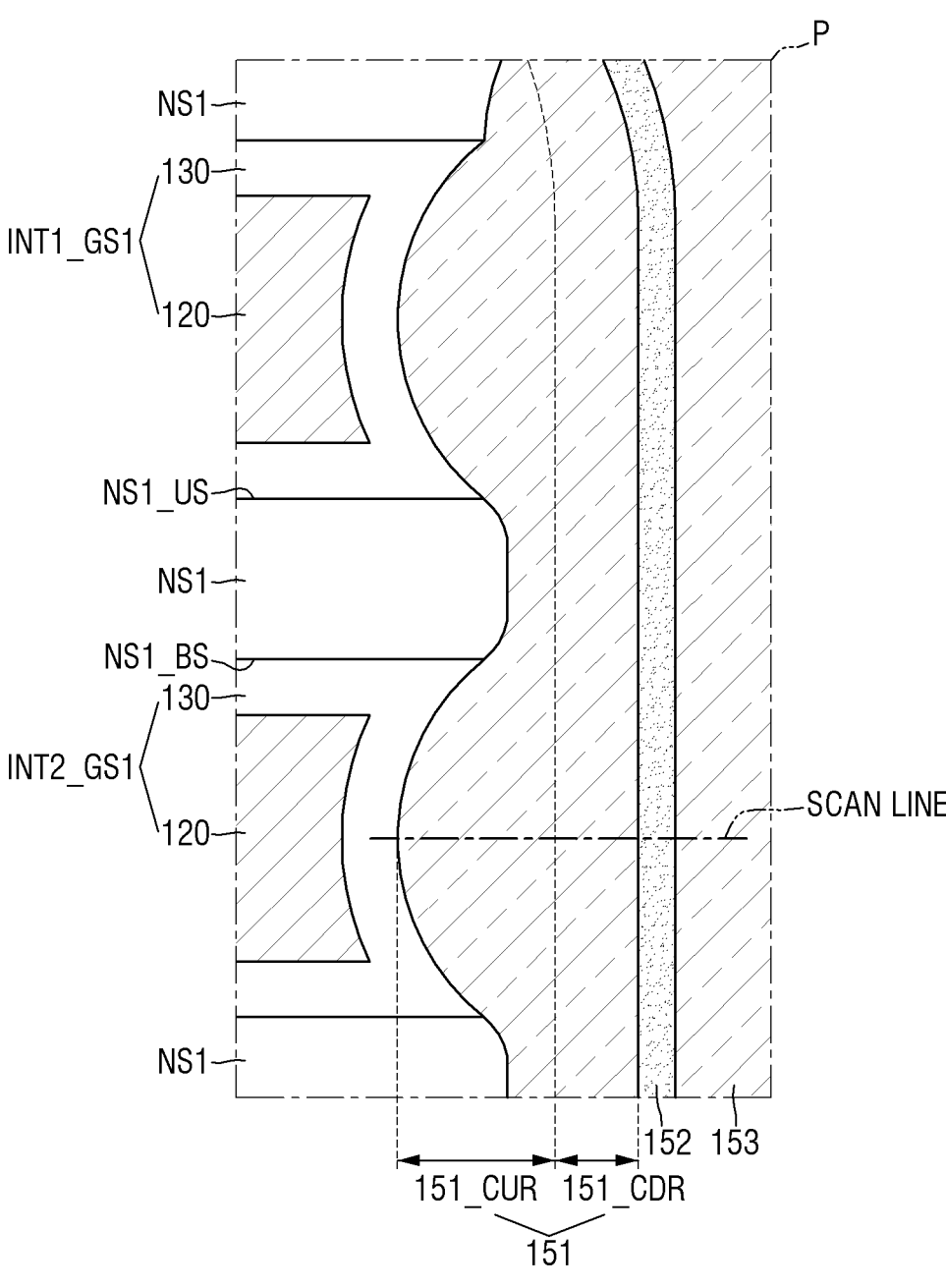
FIG. 9 is a cross-sectional view of a semiconductor device according to some embodiments of the present disclosure.
Figure 10:
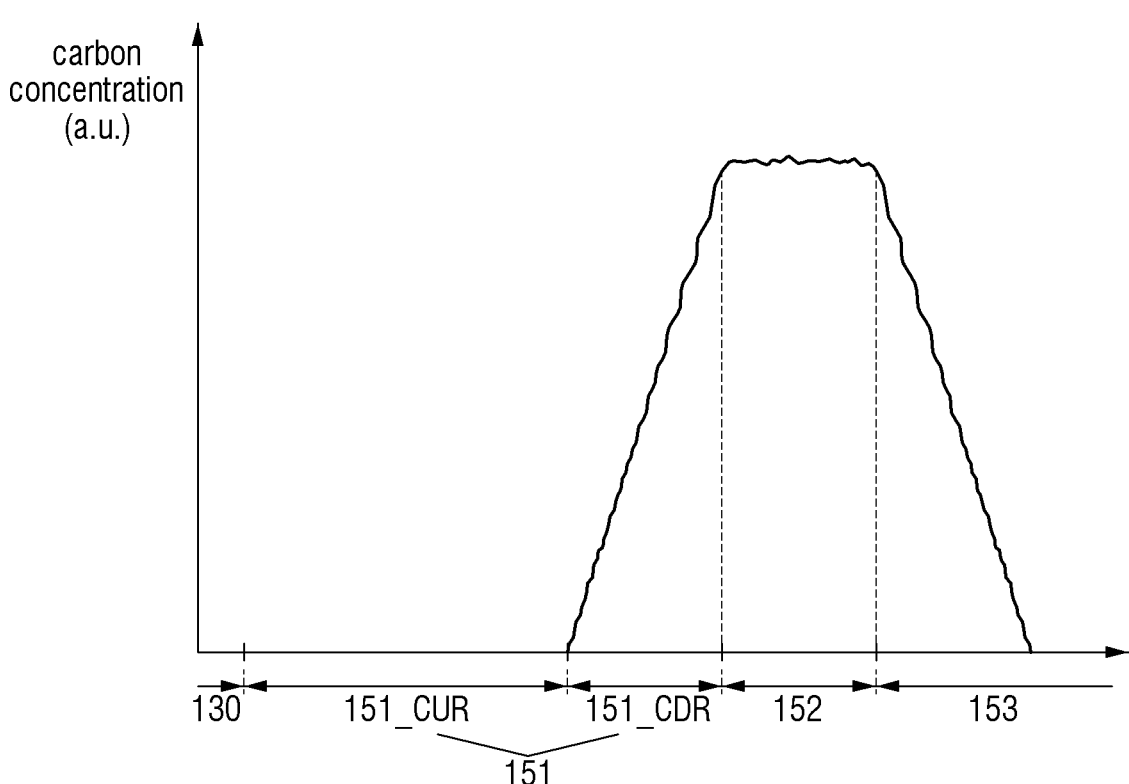
FIG. 10 is a graph showing the concentration of C along the scan line "SCAN LINE" of FIG. 9.

FIG. 9 is a cross-sectional view of a semiconductor device according to some embodiments of the present disclosure. FIG. 10 is a graph showing the concentration of C along the scan line "SCAN LINE" of FIG. 9. For convenience, the embodiment of FIGS. 9 and 10 will hereinafter be described, focusing mainly on the differences with the embodiment of FIGS. 1 through 8. Specifically, FIG. 9 is an enlarged cross-sectional view of part P (of FIG. 2) of a semiconductor device according to some embodiments of the present disclosure.

Referring to FIGS. 9 and 10, a first lower semiconductor liner 151 may include a C-undoped region 151 and a C-diffused region 151_CDR.

The C-diffused region 151_CDR may be part of the first lower semiconductor liner 151 where some of the C that was doped into the first upper semiconductor liner 152 has diffused. The concentration of C in the C-diffused region 151_CDR may increase with respect to an increase in distance away from the C-undoped region 151_CUR. In other words, the concentration of C in the C-diffused region 151_CDR decreases with respect to an increase in distance away from a first filling semiconductor film 153. Alternatively, the first filling semiconductor film 153 may not include diffused C (such as C diffused from the first upper semiconductor liner 152).

For example, the C-undoped region 151_CUR may extend along the sidewalls and the bottom surface of a first source/drain recess 150R. The C-undoped region 151_CUR may be continuously formed along the sidewalls and the bottom surface of the first source/drain recess 150R.

The C-diffused region 151_CDR is disposed between the first upper semiconductor liner 152 and the C-undoped region 151_CUR. The C-diffused region 151_CDR may extend along the sidewalls and the bottom surface of the first source/drain recess 150R. The C-diffused region 151_CDR may be part of a liner portion of the first lower semiconductor liner 151. In other words, the C-diffused region 151_CDR may not be in contact with the ends of the first sheet patterns NS1.

The C-undoped region 151_CUR may be in contact with first gate insulating films 130 of first and second inner gate structures INT1_GS1 and INT2_GS1. The C-diffused region 151_CDR may not be in contact with the first gate insulating films 130 of the first and second inner gate structures INT1_GS1 and INT2_GS1.

Figure 11:
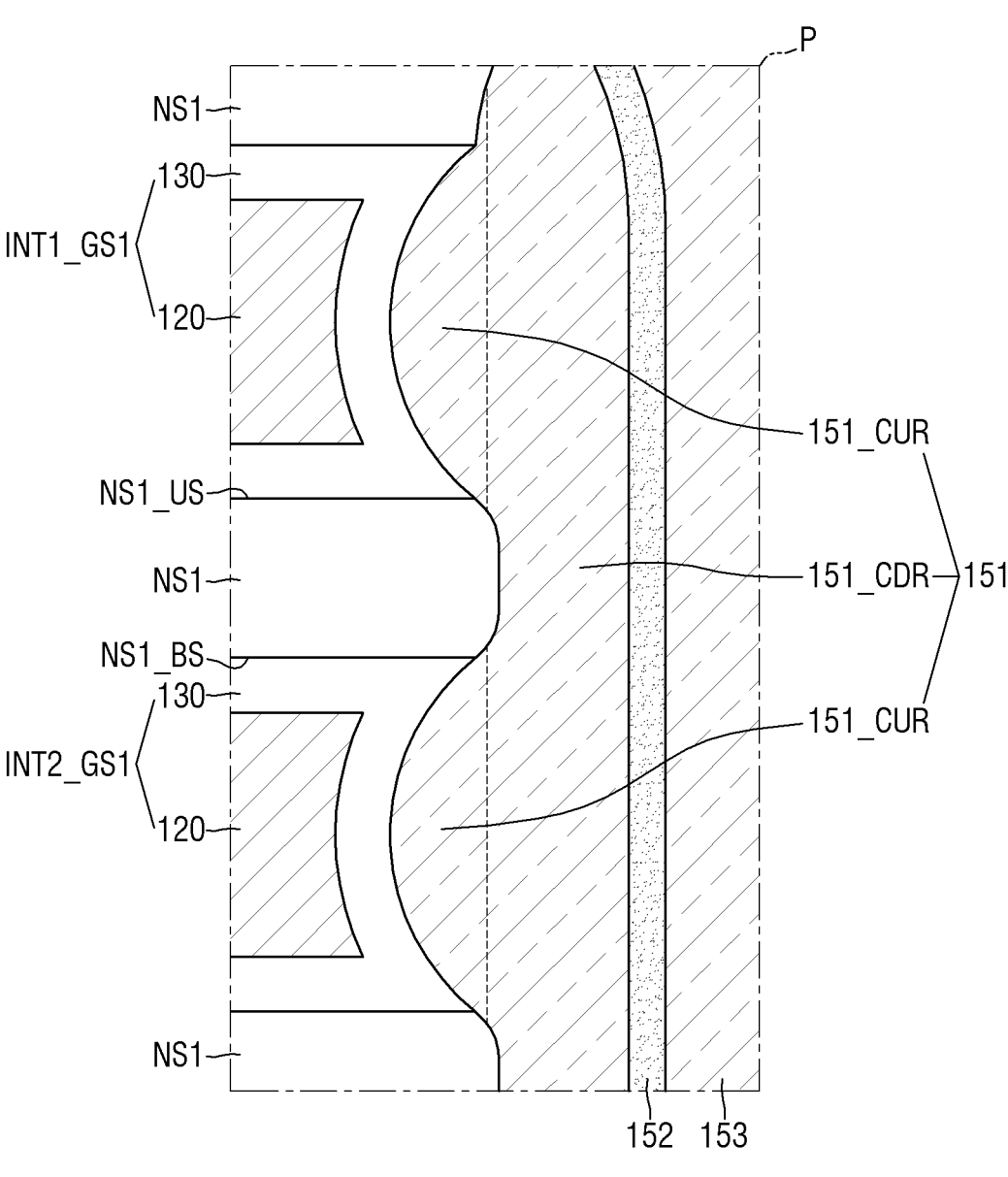
FIG. 11 is a cross-sectional view of a semiconductor device according to some embodiments of the present disclosure.

FIG. 11 is a cross-sectional view of a semiconductor device according to some embodiments of the present disclosure. For convenience, the embodiment of FIG. 11 will hereinafter be described, focusing mainly on the differences with the embodiment of FIGS. 9 and 10. Specifically, FIG.

11 is an enlarged cross-sectional view of part P (of FIG. 2) of a semiconductor device according to some embodiments of the present disclosure.

Referring to FIG. 11, a C-undoped region 151_CUR may not be continuously formed along the sidewalls and the bottom surface of a first source/drain recess 150R.

In a cross-sectional view, several C-undoped regions 151_CUR may be in the shape of islands that are spaced apart from one another. The C-undoped regions 151_CUR may comprise a plurality of sub-C-undoped regions that are spaced apart from one another in a third direction D3.

For example, the C-undoped region 151_CUR may include discrete first and second sub-C-undoped regions that are spaced apart from each other in the third direction D3 and separated from one another by the carbon doped region 151_CDR. The first sub-C-undoped region may not be directly connected to the second sub-C-undoped region (the first and second sub-C-undoped regions are not part of a larger continuous C-undoped region). The first C-undoped region may be separated from the second sub-C-undoped region through a C-diffused region 151_CDR (which contacts both the first and second sub-C-undoped regions).

The C-diffused regions 151_CDR may be in contact with the ends of first sheet patterns NS1. For example, the C-diffused region 151_CDR may not be in contact with first gate insulating films 130 of first and second inner gate structures INT1_GS1 and INT2_GS1.

Alternatively, parts of the first and second inner gate structures INT1_GS1 and INT2_GS1 may be in contact with the C-diffused region 151_CDR.

Figure 12:
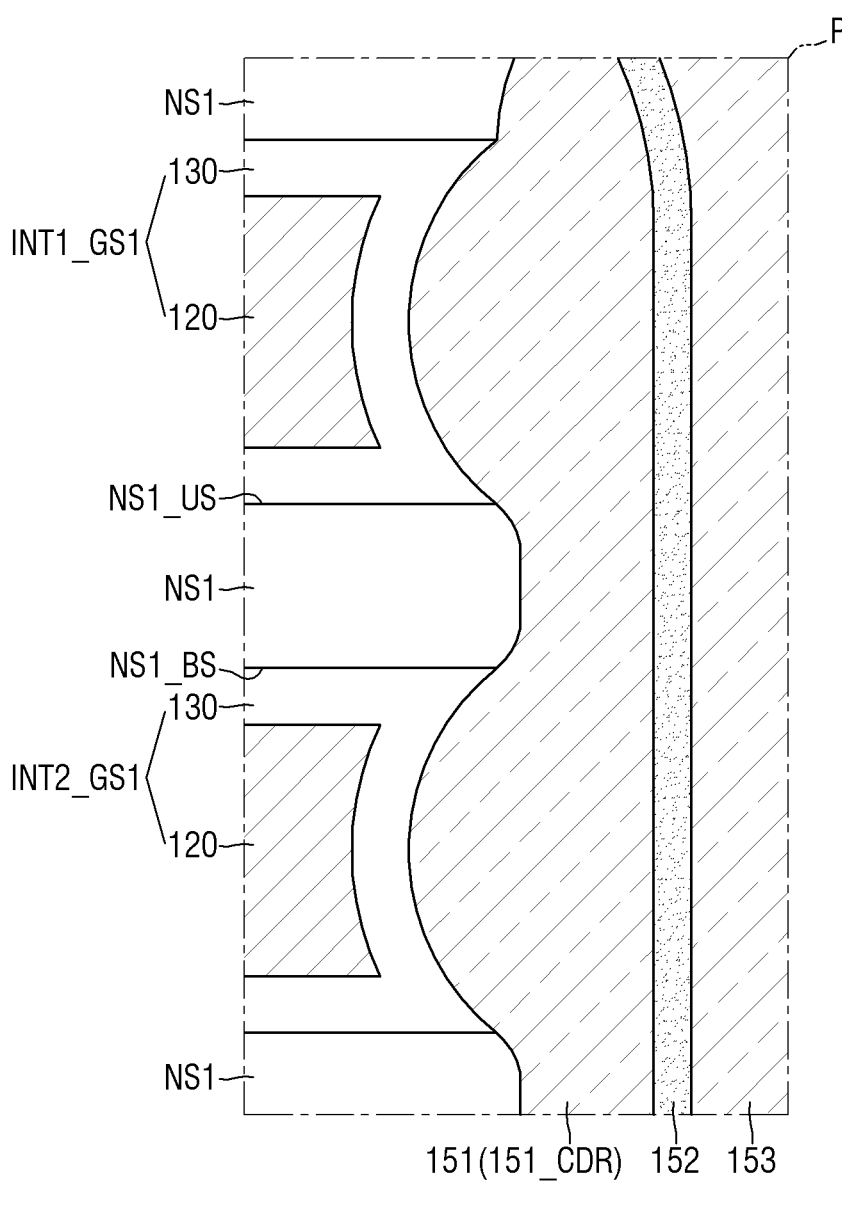
FIG. 12 is a cross-sectional view of a semiconductor device according to some embodiments of the present disclosure.
Figure 13:
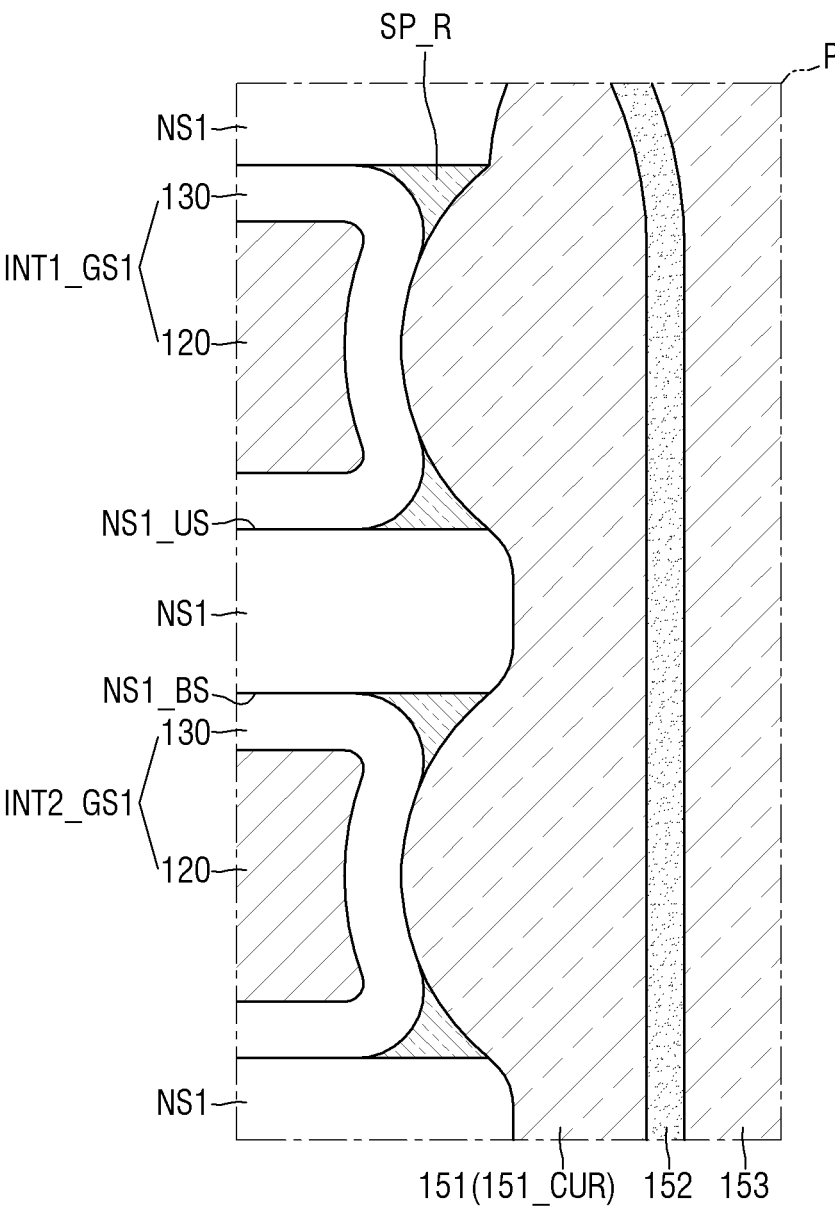
FIG. 13 is a cross-sectional view of a semiconductor device according to some embodiments of the present disclosure.
Figure 14:
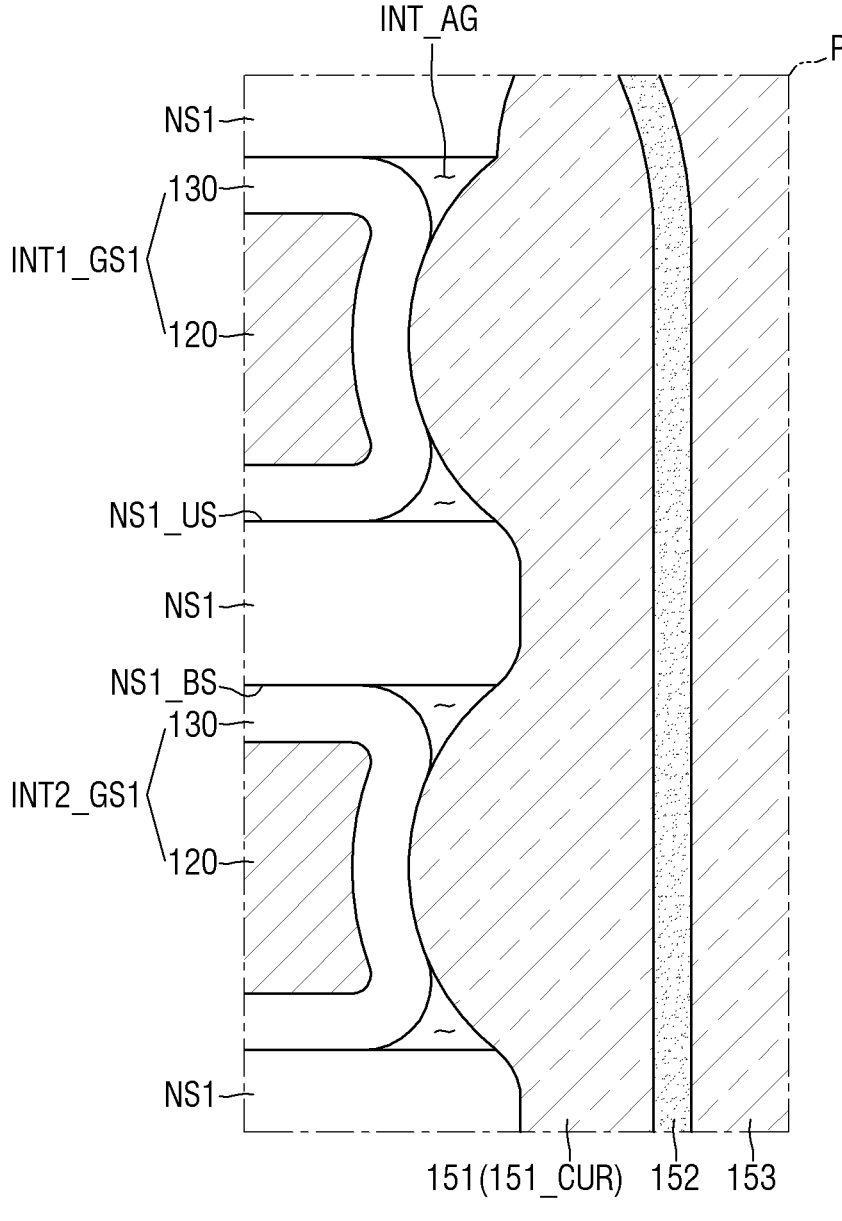
FIG. 14 is a cross-sectional view of a semiconductor device according to some embodiments of the present disclosure.

FIG. 12 is a cross-sectional view of a semiconductor device according to some embodiments of the present disclosure. FIG. 13 is a cross-sectional view of a semiconductor device according to some embodiments of the present disclosure. FIG. 14 is a cross-sectional view of a semiconductor device according to some embodiments of the present disclosure. For convenience, the embodiments of FIGS. 12 through 14 will hereinafter be described, focusing mainly on the differences with the embodiment of FIGS. 1 through 8. Specifically, FIGS. 12 through 14 are enlarged cross-sectional views of parts P (of FIG. 2) of semiconductor devices according to some embodiments of the present disclosure.

Referring to FIG. 12, an entire first lower semiconductor liner 151 may be a C-diffused region 151_CDR.

The first lower semiconductor liner 151 may not include a C-undoped region ("151_CUR" of FIG. 11).

Referring to FIG. 13, the semiconductor device according to some embodiments of the present disclosure may further include semiconductor residue patterns SP_R, which are disposed between a first lower semiconductor liner 151 and inner gate structures (as shown with respect to first and second inner gate structures INT1_GS1 and INT2_GS1). It should be understood that such semiconductor residue patterns SP_R may be formed with respect to other of the embodiments described herein.

The semiconductor residue patterns SP_R may be in contact with first sheet patterns NS1. The semiconductor residue patterns SP_R may be in contact with an outer sidewall ("151_OSW" of FIG. 4) of the first lower semiconductor liner 151 and sidewalls of the first and second inner gate structures INT1_GS1 and INT2_GS1.

The semiconductor residue patterns SP_R may include, for example, SiGe. In a case where the first lower semiconductor liner 151 includes SiGe, the Ge fraction of the semiconductor residue patterns SP_R may be greater than the Ge fraction of the first lower semiconductor liner 151.

The semiconductor residue patterns SP_R may be parts of sacrificial patterns ("SC_L" of FIG. 29) that remain unremoved.

Referring to FIG. 14, the semiconductor device according to some embodiments of the present disclosure may further include inner gate airgaps INT_AG, which are disposed between a first lower semiconductor liner 151 and first and second inner gate structures INT1_GS1 and INT2_GS1. It should be understood that such inner gate airgaps INT_AG may be formed with respect to other of the embodiments described herein (although the formation of both inner gate airgaps INT_AG and semiconductor residue patterns SP_R described with respect to FIG. 13 may result in smaller sizes of both).

The inner gate airgaps INT_AG may be disposed between the first lower semiconductor liner 151 and first gate insulating films 130 of the first and second inner gate structures INT1_GS1 and INT2_GS1. The inner gate airgaps INT_AG may be defined between the first lower semiconductor liner 151, first sheet patterns NS1, and the first and second inner gate structures INT1_GS1 and INT2_GS1.

Although not specifically illustrated, in a case where the first gate insulating films 130 include interfacial films and high-k insulating films, the interfacial films may be formed on parts of the first lower semiconductor liner 151 that are in contact with the inner gate airgaps INT_AG.

Figure 15:
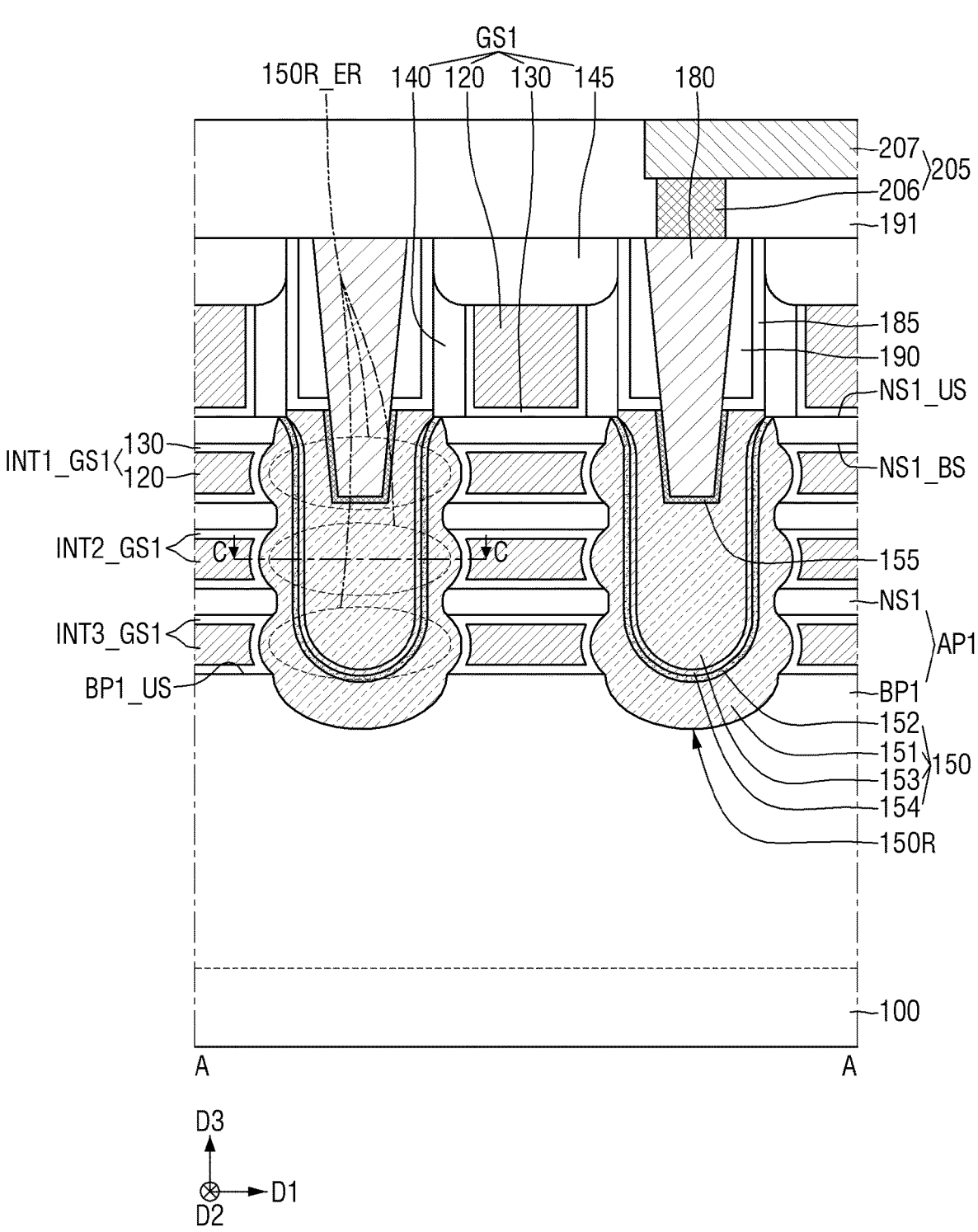
FIGS. 15 and 16 illustrate a semiconductor device according to some embodiments of the present disclosure.
Figure 16:
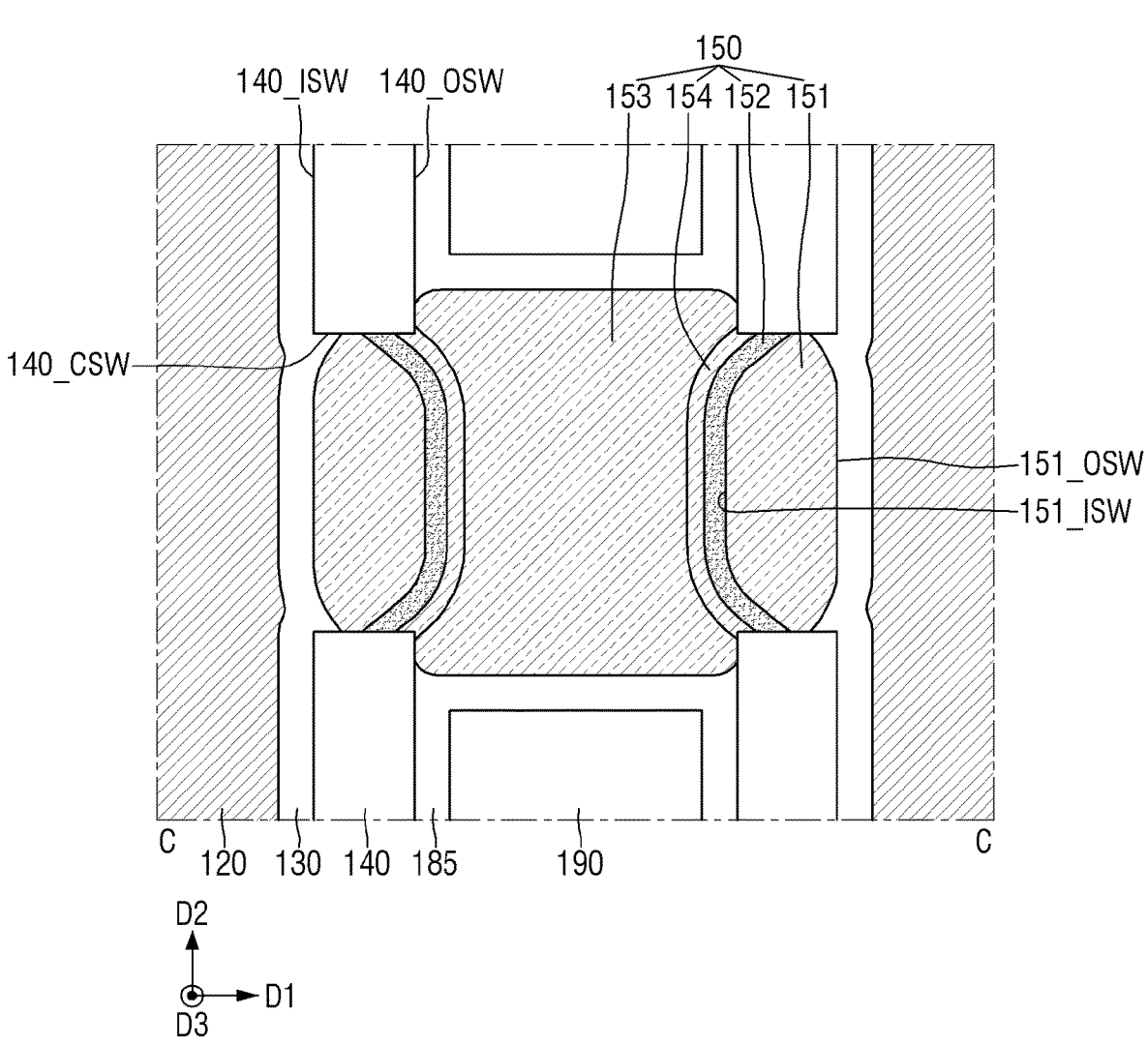

FIGS. 15 and 16 illustrate a semiconductor device according to some embodiments of the present disclosure. The embodiment of FIGS. 15 and 16 will hereinafter be described, focusing mainly on the differences with the embodiment of FIGS. 1 through 8. Specifically, FIG. 15 is a cross-sectional view, taken along line A-A of FIG. 1, of a semiconductor device according to some embodiments of the present disclosure, and FIG. 16 is a plan view, taken along line C-C of FIG. 15, of the semiconductor device of FIG. 15.

Referring to FIGS. 15 and 16, a first source/drain pattern 150 may further include an inserted semiconductor liner 154, which is disposed between a first upper semiconductor liner 152 and a first filling semiconductor film 153.

The inserted semiconductor liner 154 may extend along the boundary between the first upper semiconductor liner 152 and the first filling semiconductor film 153.

In a case where the first source/drain pattern 150 is included in an NMOS source/drain, the inserted semiconductor liner 154 may be doped with second n-type impurities. The inserted semiconductor liner 154 may be Si doped with second n-type impurities. For example, the second n-type impurities may be different from the first n-type impurities doped in the first filling semiconductor film 153 (i.e., the second n-type impurities may not be doped in the first filling semiconductor film 153 and the first n-type impurities may not be doped in the inserted semiconductor liner 154). In some examples, the first n-type impurity may be P and the second n-type impurities may include at least one of As, Sb, and Bi. For example, the inserted semiconductor liner 154 may include a Si film doped with As.

In a case where the first source/drain pattern 150 is included in a PMOS source/drain, the inserted semiconductor liner 154 may include SiGe doped with p-type impurities. The Ge fraction of the first filling semiconductor film 153 may be greater than the Ge fraction of the inserted semiconductor liner 154. In a case where the first upper semiconductor liner 152 includes SiGe, the Ge fraction of the inserted semiconductor liner 154 may be greater than the Ge fraction of the first upper semiconductor liner 152.

Figure 17:
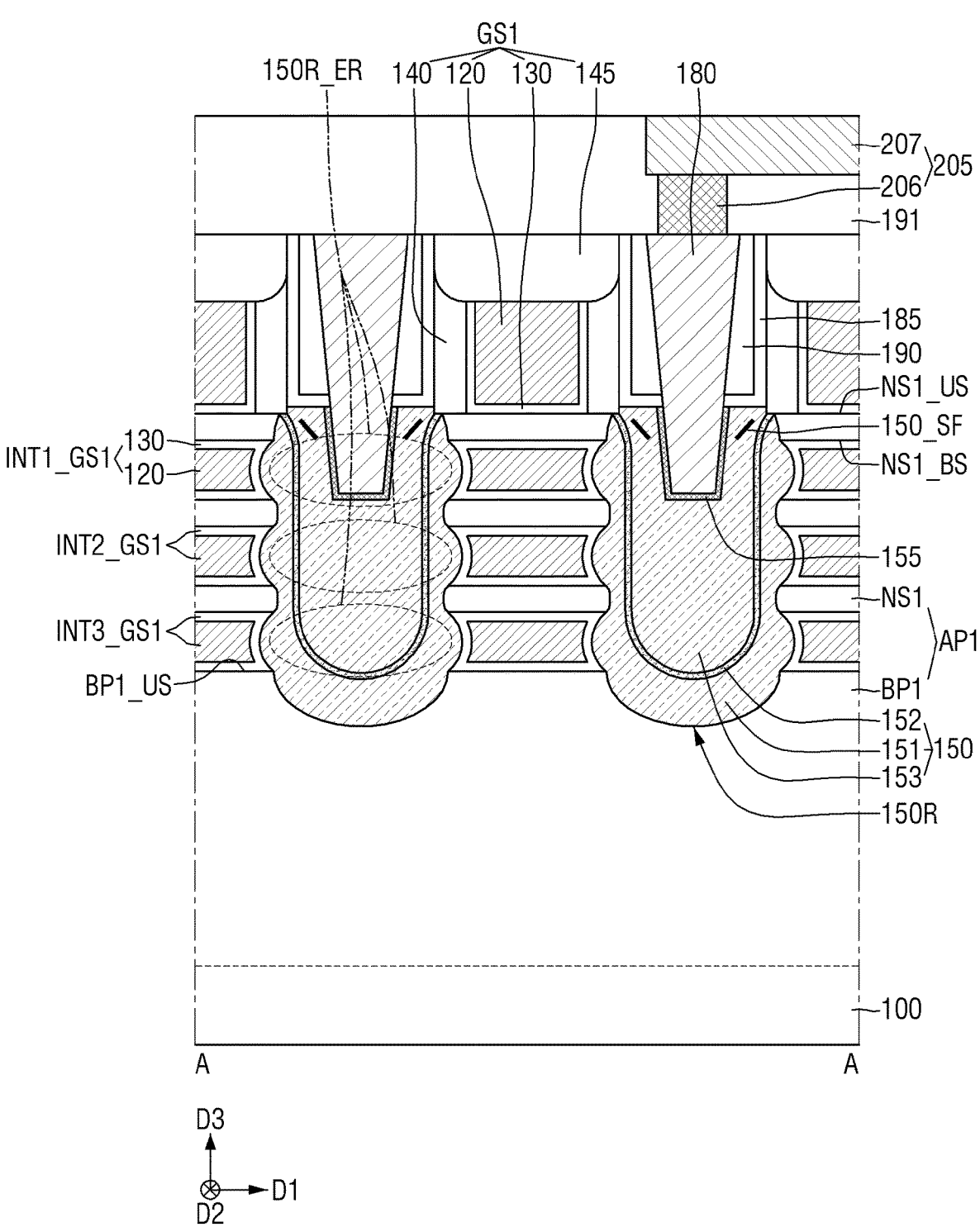
FIGS. 17 through 19 are cross-sectional views of semiconductor devices according to some embodiments of the present disclosure.
Figure 18:
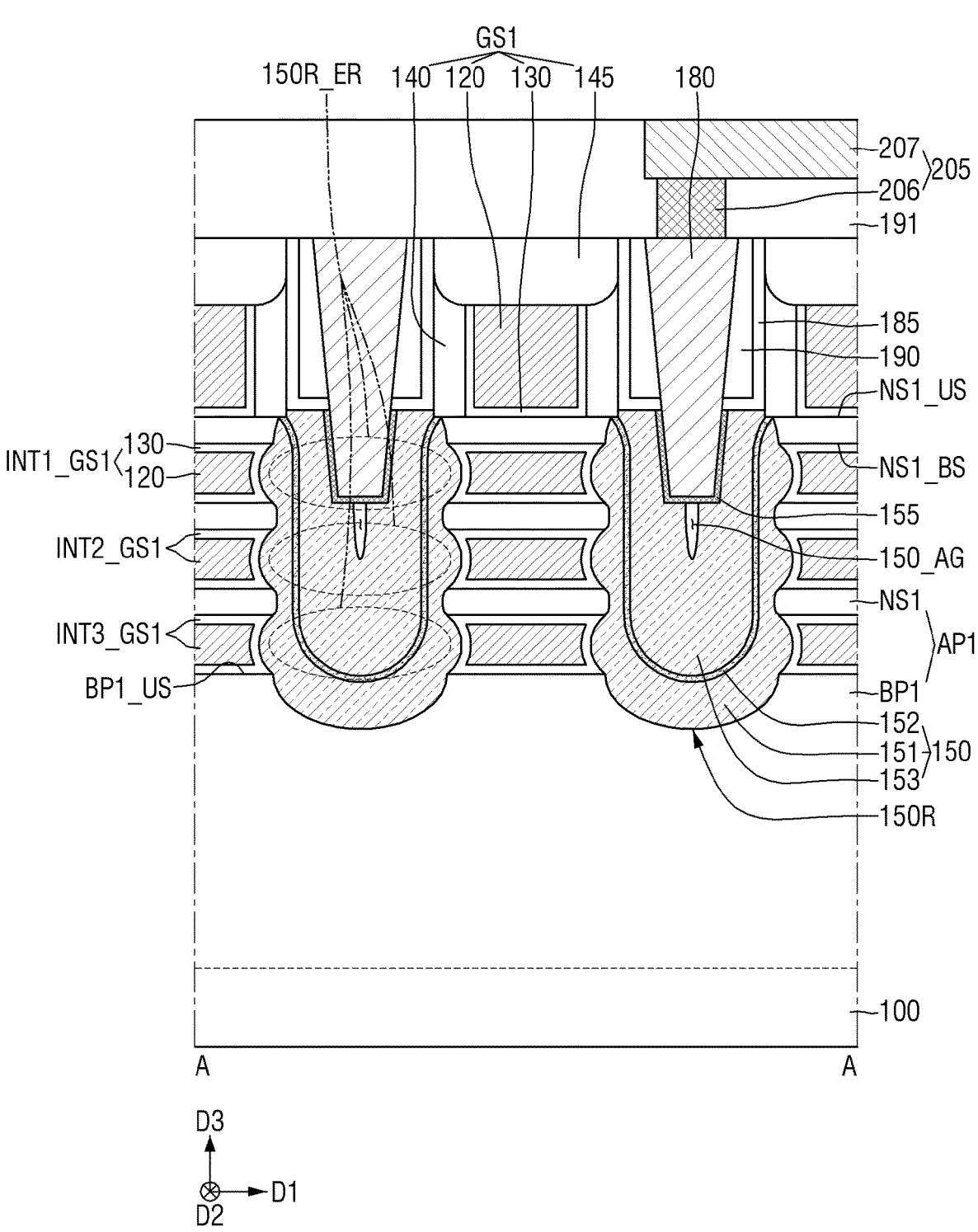
Figure 19:
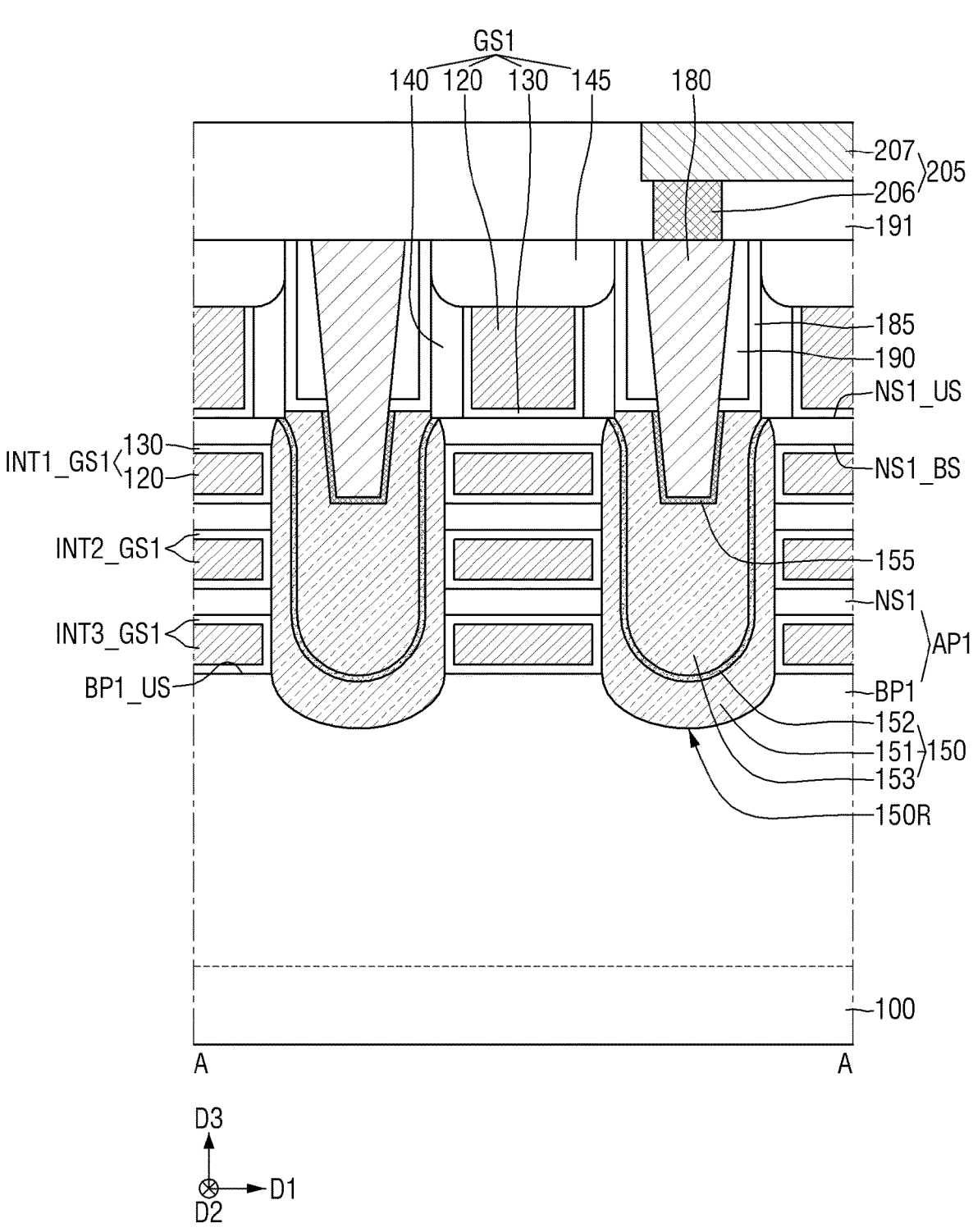
Figure 20:
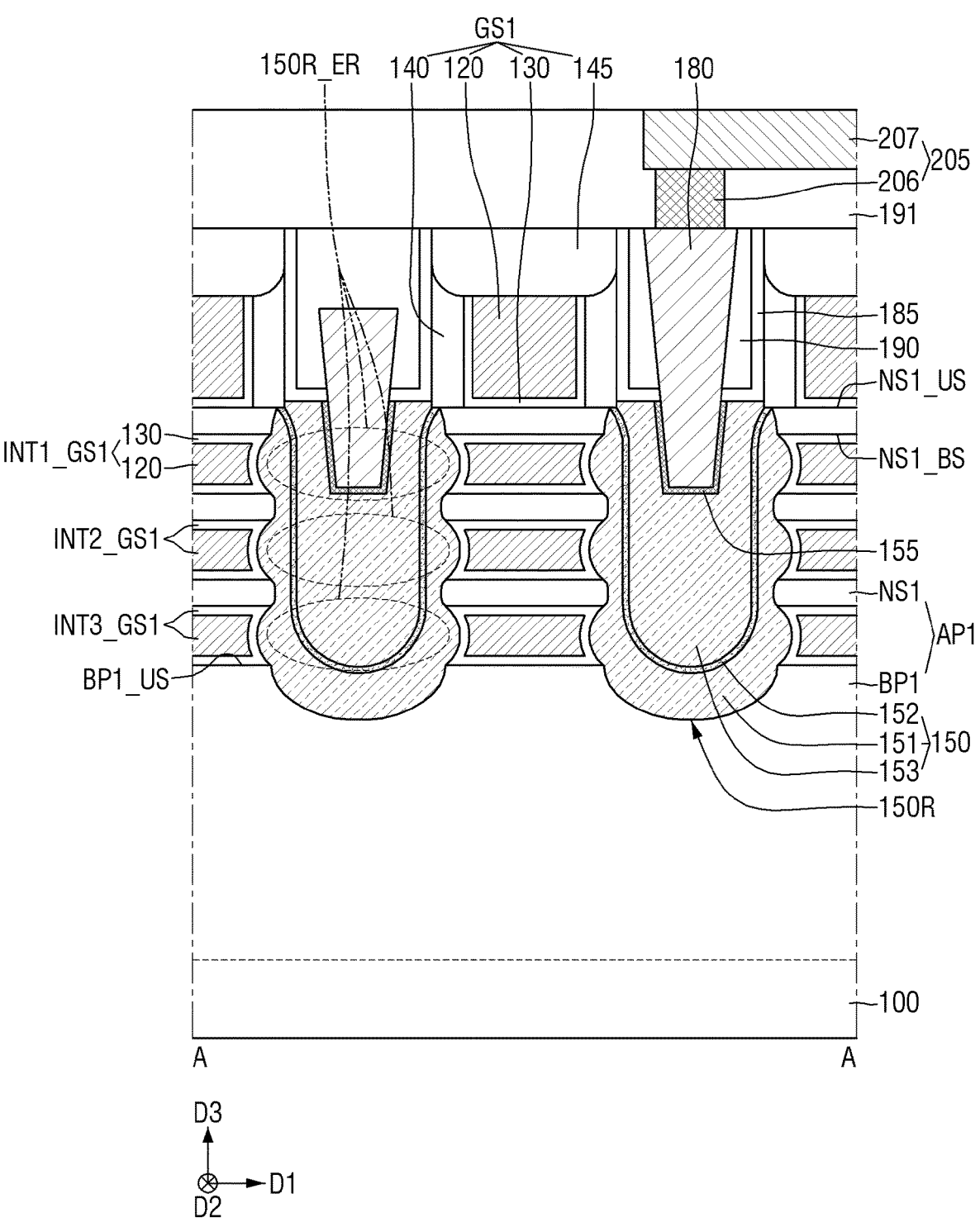
FIGS. 20 and 21 are cross-sectional views of semiconductor devices according to some embodiments of the present disclosure.
Figure 21:
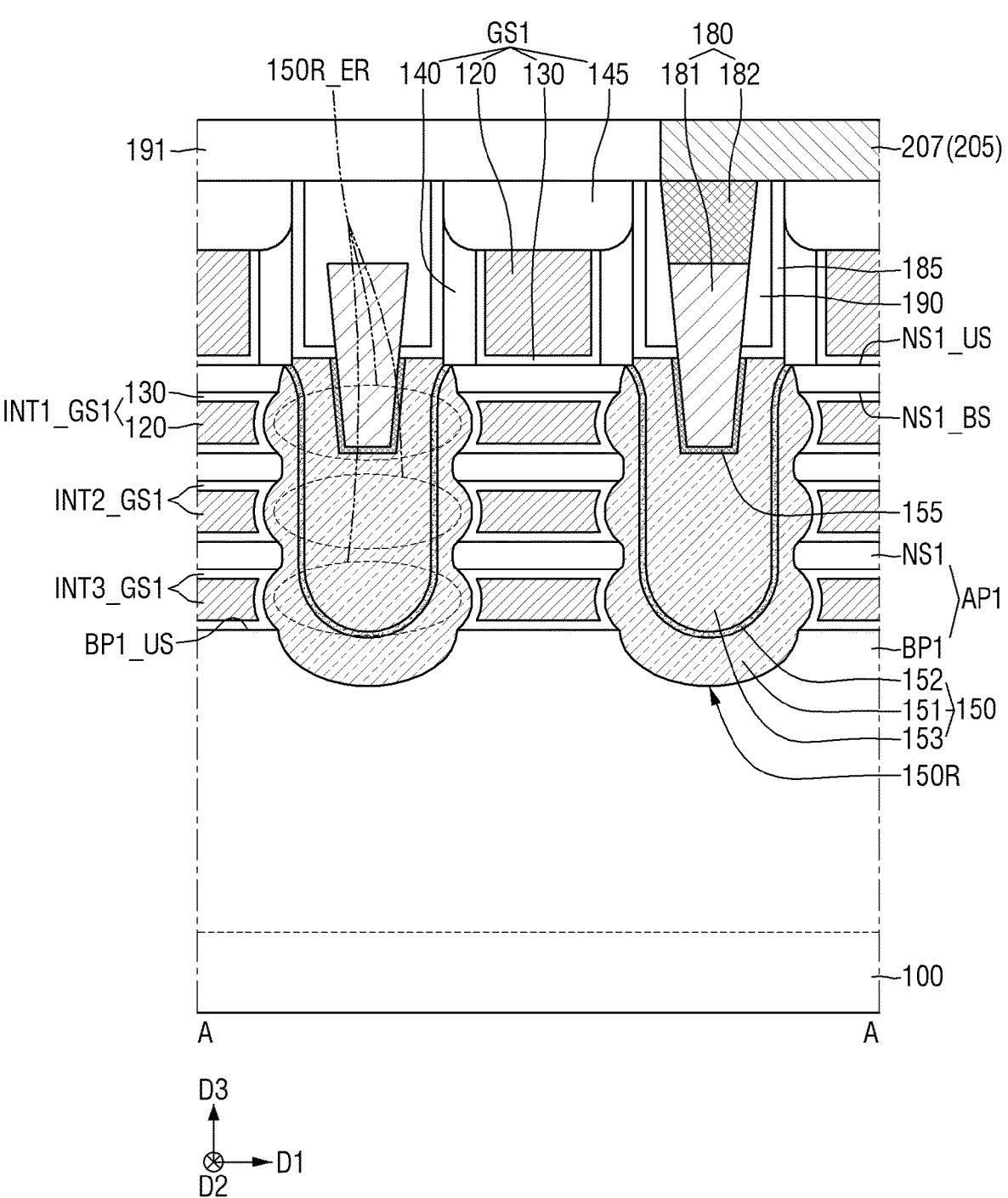

FIGS. 17 through 19 are cross-sectional views of semiconductor devices according to some embodiments of the present disclosure. FIGS. 20 and 21 are cross-sectional views of semiconductor devices according to some embodiments of the present disclosure. For convenience, the embodiments of FIGS. 17 through 21 will hereinafter be described, focusing mainly on the differences with the embodiment of FIGS. 1 through 8.

Referring to FIG. 17, a first source/drain pattern 150 may include stacking faults 150_SF. It should be understood that these stacking faults 150_SF may be provided with (to modify) any of the embodiments described herein.

The stacking faults 150_SF are disposed in a first filling semiconductor film 153. In a cross-sectional view, the stacking faults 150_SF may be inclined in a direction from first gate spacers 140 to a first lower pattern BP1.

Referring to FIG. 18, a first source/drain pattern 150 may include source/drain airgaps 150_AG. It should be understood that these airgaps 150_AG may be provided with (to modify) any of the embodiments described herein.

The source/drain airgaps 150_AG are disposed in a first filling semiconductor film 153.

Referring to FIG. 19, each of first source/drain recesses 150R does not include width-expanded regions ("150R_ER" of FIG. 2).

Each of first source/drain recesses 150R does not have wavy sidewalls. The width of upper parts of the sidewalls of each of the first source/drain recesses 150R may decrease away from a first lower pattern BP1. It should be understood that other embodiments described herein may be similarly modified to not include the width-expanded regions and/or to not have wavy sidewalls.

Referring to FIG. 20, the upper surface of a first source/drain contact 180 not connected to a wiring 205 may be lower than the upper surfaces of first gate capping patterns 145.

The upper surface of a first source/drain contact 180 connected to the wiring 205 may be higher than the upper surface of the first source/drain contact 180 not connected to the wiring 205. It should be understood that other embodiments described herein may be similarly modified to include features of FIG. 20.

Referring to FIG. 21, each of first source/drain contacts 180 may include a lower source/drain contact 181 and an upper source/drain contact 182.

The upper source/drain contact 182 may be disposed in a first source/drain contact 180 connected to a wiring 205. On the contrary, the upper source/drain contact 182 may not be disposed in a first source/drain contact 180 not connected to the wiring 205.

A wiring line 207 may be connected to the first source/drain contacts 180 without the aid of a wiring via ("206" of FIG. 2). The wiring 205 may not include a wiring via ("206" of FIG. 2).

The lower source/drain contact 181 and the upper source/drain contact 182 are illustrated as being single homogenous films, but the present invention is not limited thereto. The lower source/drain contact 181 and the upper source/drain contact 182 may be formed of one or more of, for example, a metal, a metal alloy, a conductive metal nitride, a conductive metal carbide, a conductive metal oxide, a conductive metal carbonitride, and a 2D material. It should be understood that other embodiments described herein may be similarly modified to include features of FIG. 21.

Figure 22:
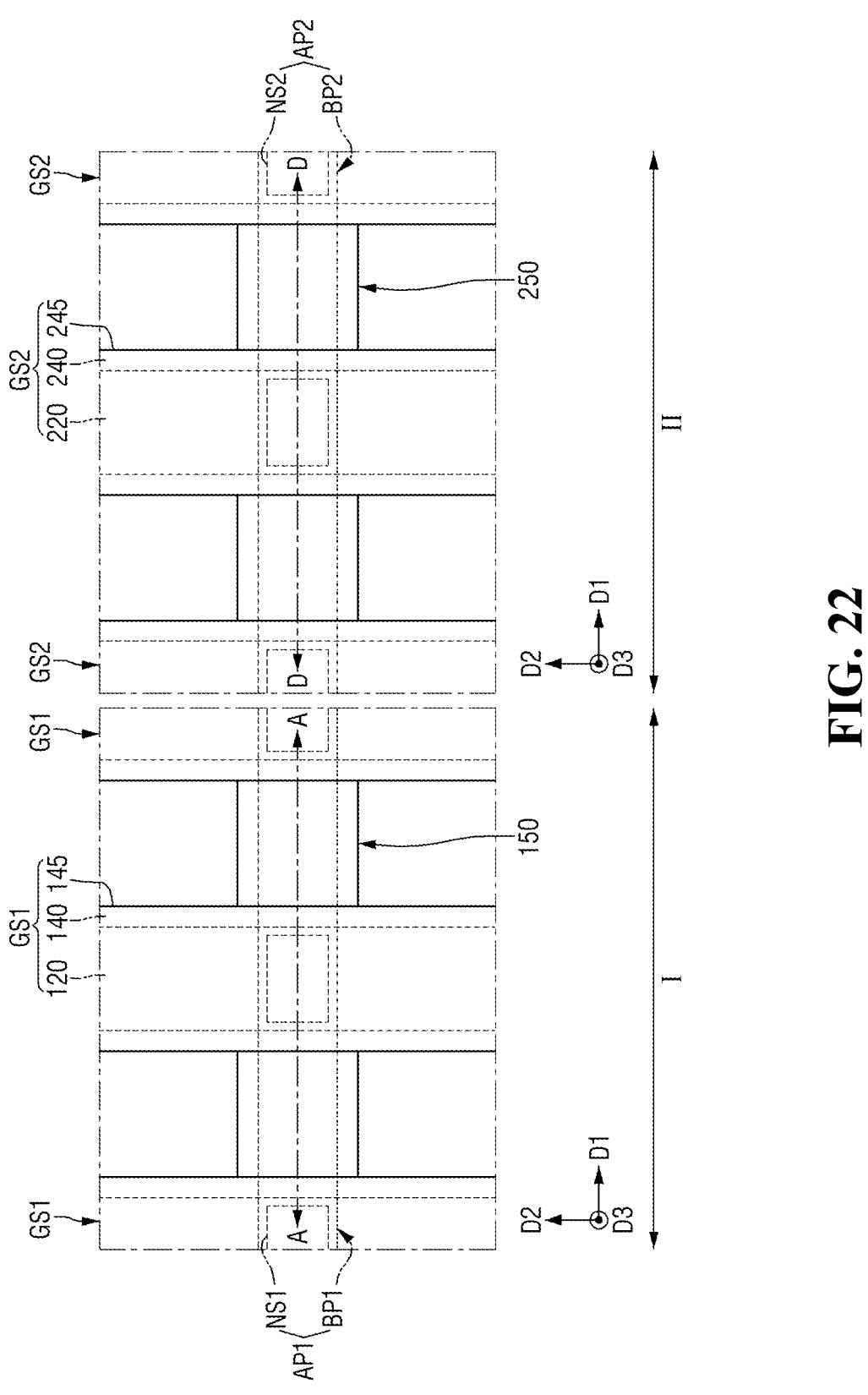
FIGS. 22 and 23 illustrate a semiconductor device according to some embodiments of the present disclosure.
Figure 23:
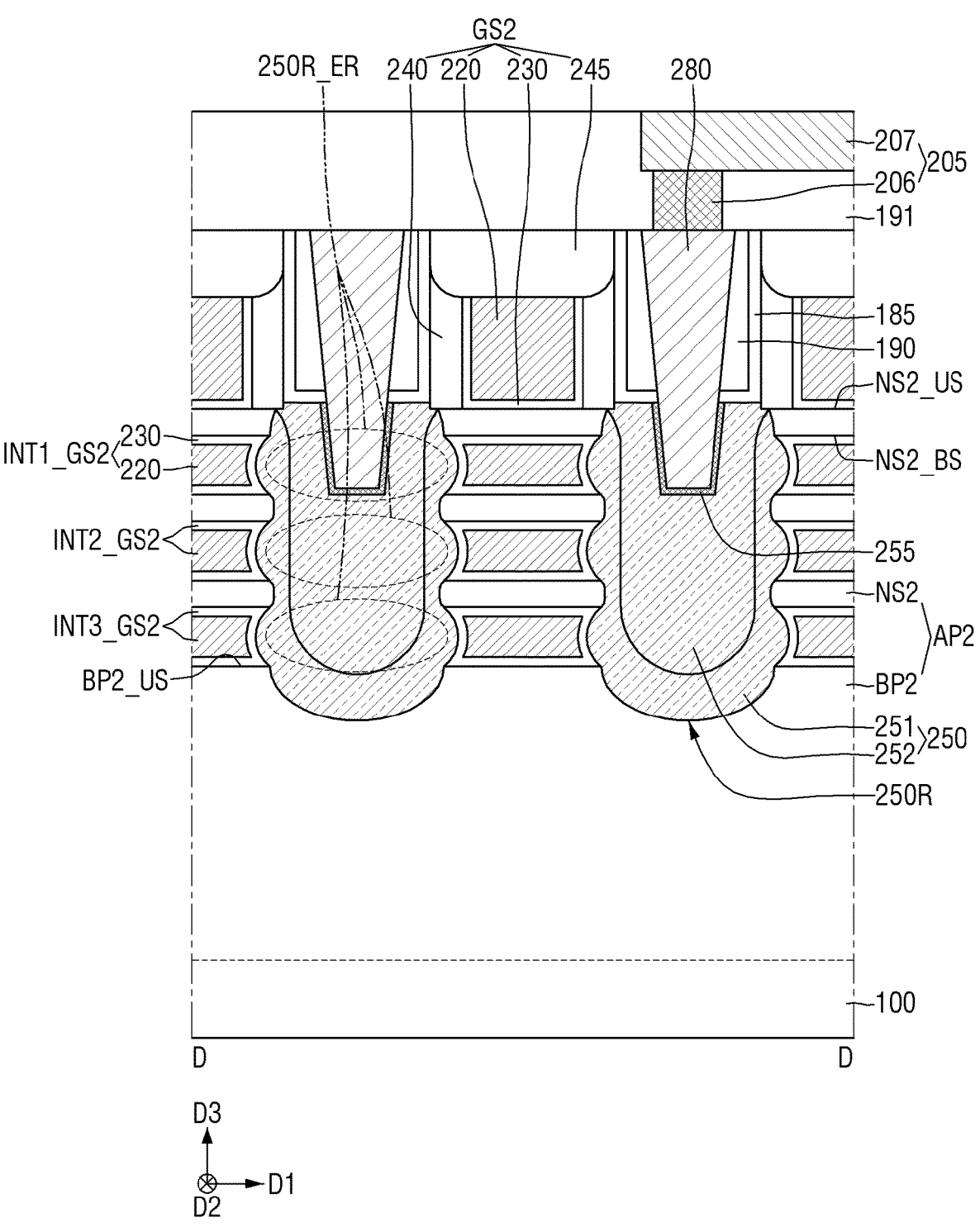

FIGS. 22 and 23 illustrate a semiconductor device according to some embodiments of the present disclosure. Specifically, FIG. 22 is a plan view of a semiconductor device according to some embodiments of the present disclosure, and FIG. 23 is a cross-sectional view taken along line D-D of FIG. 22.

A cross-sectional view, taken along line A-A, of the semiconductor device of FIG. 22 may be as illustrated in any one of FIGS. 2, 15, and 17 through 29. A first region I of FIG. 22 may be the same as the NMOS region embodiments described above with reference to FIGS. 1 through 19, and thus, a second region II of FIG. 22 will hereinafter be described in detail.

Referring to FIGS. 22 and 23, the semiconductor device according to some embodiments of the present disclosure may include a first active pattern AP1, a plurality of first gate structures GS1, a first source/drain pattern 150, a second active pattern AP2, a plurality of second gate structures GS2, and a second source/drain pattern 250.

A substrate 100 may include the first and second regions I and II. The first region I may be a region where an NMOS is formed, and the second region II may be a region where a PMOS is formed.

The first active pattern AP1, the first gate structures GS1, and the first source/drain pattern 150 may be disposed in the first region I of the substrate 100. The second active pattern AP2, the second gate structures GS2, and the second source/drain pattern 250 may be disposed in the second region II of the substrate 100.

The second active pattern AP2 may include a second lower pattern BP2 and a plurality of second sheet patterns NS2. The second sheet patterns NS2 are disposed on an upper surface BP2_US of the second lower pattern BP2. Each of the second sheet patterns NS2 may have an upper surface NS2_US and a bottom surface NS2_BS that are opposite to each other in a third direction D3. The second lower pattern BP2 and the second sheet patterns NS2 may be a crystalline semiconductor material and be formed of and/or include an element semiconductor material (such as Si or Ge), a group IV-IV compound semiconductor, and a group III-V compound semiconductor. The second lower pattern BP2 may be a Si lower pattern formed of or including Si, and the second sheet patterns NS2 may be Si sheet patterns containing Si.

The second gate structures GS2 may be disposed on the substrate 100. Each second gate structure GS2 may be disposed on the second active pattern AP2. The second gate structures GS2 may intersect the second active pattern AP2. The second gate structures GS2 may intersect the second lower pattern BP2. The second gate structures GS2 may surround each of the second sheet patterns NS2. Each of the second gate structures GS2 may include a plurality of inner gate structures (INT1_GS2, INT2_GS2, and INT3_GS2), which are disposed between second sheet patterns NS2 that are adjacent to one another in the third direction D3 or between the second lower pattern BP2 and the second sheet patterns NS2. Each of the second gate structures GS2 may include, for example, a second gate electrode 220, second gate insulating films 230, second gate spacers 240, and a second gate capping pattern 245.

The second source/drain pattern 250 may be on the second active pattern AP2. The second source/drain pattern 250 may be formed on the second lower pattern BP2. The second source/drain patterns 250 may be connected to the second sheet patterns NS2. The second source/drain pattern 250 may form a sources/drain of a transistor using second sheet patterns NS2 as channel regions.

The second source/drain patterns 250 may be disposed in second source/drain recesses 250R. Each of the second source/drain recesses 250R may include a plurality of width-expanded regions 250R_ER. The bottom surfaces of the second source/drain recesses 250R may be defined by the second lower pattern BP2. The sidewalls of each of the second source/drain recesses 250R may be defined by the second inner patterns NS2 and the inner gate structures (INT1_GS2, INT2_GS2, and INT3_GS2).

The second source/drain pattern 250 may be in contact with the second gate insulating films 230 of the inner gate structures (INT1_GS2, INT2_GS2, and INT3_GS2) and with the second lower pattern BP2. The second source/drain pattern 250 may include second semiconductor liners 251 and second filling semiconductor films 252.

The second semiconductor liners 251 may be continuously formed along the second source/drain recesses 250R. The second semiconductor liners 251 are in contact with the second sheet patterns NS2, the second lower pattern BP2, and the second gate insulating films 230 of the inner gate structures (INT1_GS2, INT2_GS2, and INT3_GS2).

The second filling semiconductor films 252 are disposed on the second semiconductor liners 251. The second filling semiconductor films 252 may fill the second source/drain recesses 250R.

The second source/drain patterns 250 may be doped with p-type impurities. The second semiconductor liners 251 and the second filling semiconductor films 252 may be and/or include, for example, SiGe. The second semiconductor liners 251 and the second filling semiconductor films 252 may be SiGe films doped with p-type impurities. The second semiconductor liners 251 and the second filling semiconductor films 252 crystalline semiconductor material, such as an epitaxial semiconductor film (e.g., as described herein with respect to the first semiconductor lower liners 151 and first filling semiconductor films 153, but having different charge carrier dopants of p-type impurities).

The second source/drain patterns 250, unlike the first source/drain patterns 150, do not include C-doped semiconductor liners. The second source/drain pattern 250 may not include any portion that is doped with C and/or liners doped with C that extend along the sidewalls and the bottom surface of each of the second source/drain recesses 250R.

The second source/drain contacts 280 are disposed on the second source/drain pattern 250. The second source/drain contacts 280 are connected to the second source/drain pattern 250. Second metal silicide films 255 may be further disposed between the second source/drain contacts 280 and the second source/drain pattern 250. It should be appreciated that the structure of second region II may also include one or more of the modifications described herein, such as with respect to FIGS. 13-21.

FIGS. 24 through 30 are cross-sectional views illustrating a method of manufacturing a semiconductor device according to some embodiments of the present disclosure. Specifically, FIGS. 24 through 30 are cross-sectional views taken along line A-A of FIG. 1.

Figure 24:
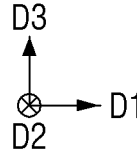

Referring to FIG. 24, a first lower pattern BP1 and an upper pattern structure U_AP may be formed on a substrate 100.

The upper pattern structure U_AP may be disposed on the first lower pattern BP1. The upper pattern structure U_AP may include a plurality of sacrificial patterns SC_L and a plurality of active patterns ACT_L, and the sacrificial patterns SC_L and the active patterns ACT_L may be alternately stacked on the first lower pattern BP1.

For example, the sacrificial patterns SC_L may include SiGe films, and the active patterns ACT_L may include Si films.

Thereafter, dummy gate insulating films 130*p*, dummy gate electrodes 120*p*, and dummy gate capping films 120_HM may be formed on the upper pattern structure U_AP. The dummy gate insulating films 130*p* may be and/or include, for example, silicon oxide, but the present invention is not limited thereto. The dummy gate electrodes 120*p* may be and/or include, for example, polysilicon, but the present invention is not limited thereto. The dummy gate capping films 120_HM may be and/or include, for example, silicon nitride, but the present invention is not limited thereto.

Pre-gate spacers 140*p* may be formed on the sidewalls of each of the first dummy gate electrodes 120*p*.

Figure 25:
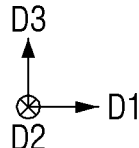
Figure 26:
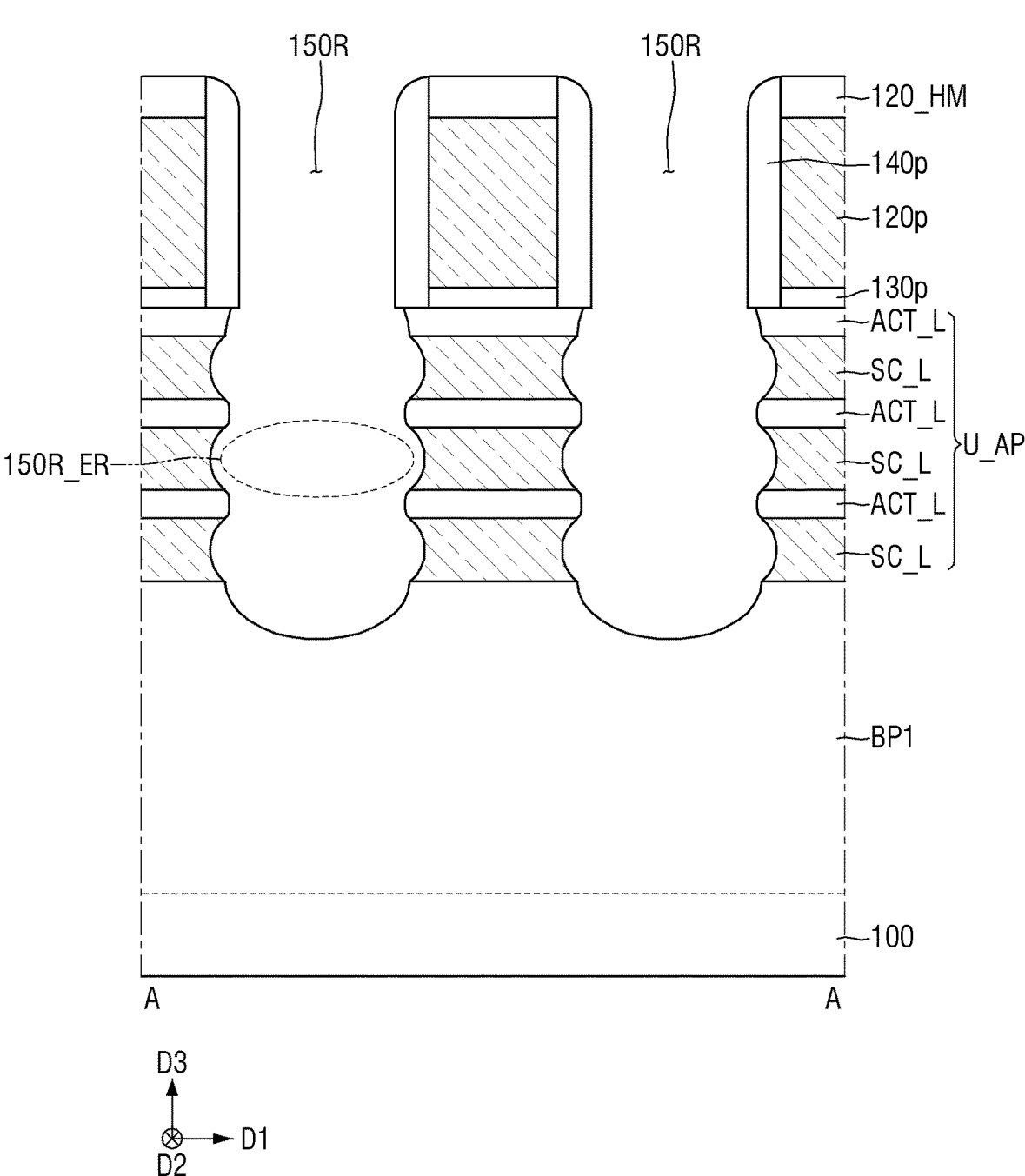

Referring to FIGS. 25 and 26, first source/drain recesses 150R may be formed in the upper pattern structure U_AP by using the dummy gate electrodes 120*p* as masks.

Parts of the first source/drain recesses 150R may be formed in the first lower pattern BP1. The bottom surfaces of the first source/drain recesses 150R may be defined by the first lower pattern BP1.

Referring to FIG. 25, the width of the first source/drain recesses 150R may increase and then decrease with respect to a first direction D1 away from the first lower pattern BP1.

Referring to FIG. 26, each of the first source/drain recesses 150R may include a plurality of width-expanded regions 150R_ER. For example, after the formation of the first source/drain recesses 150R of FIG. 25, the width-expanded regions 150R_ER may be formed by additionally etching the sacrificial patterns SC_L, but the present invention is not limited thereto. As a result, each of the first source/drain recesses 150R may have wavy sidewalls.

Subsequent processes will hereinafter be described as being performed using the first source/drain recesses 150R of FIG. 26.

Figure 27:
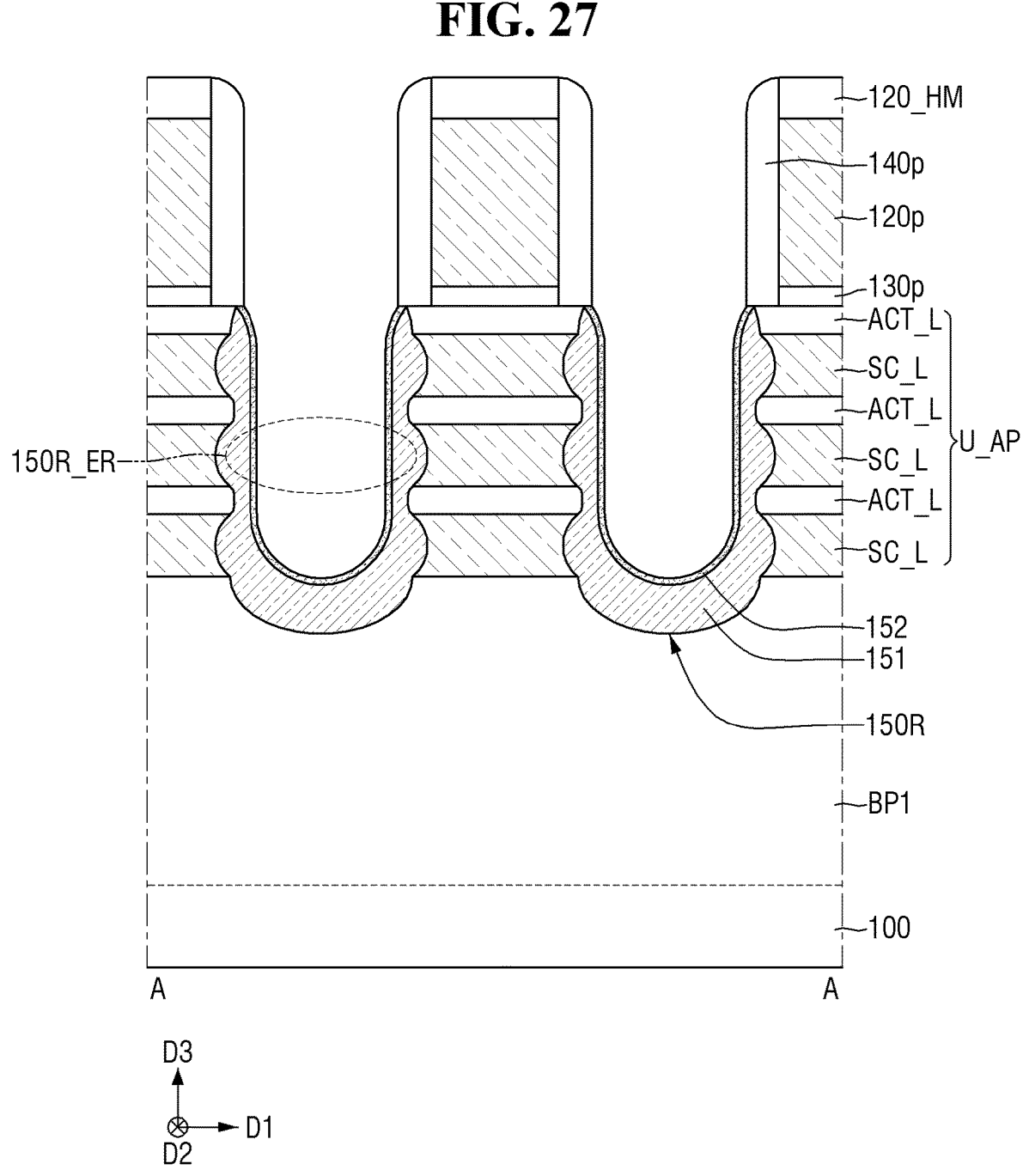

Referring to FIG. 27, first lower semiconductor liners 151 may be formed along the sidewalls and the bottom surface of each of the first source/drain recesses 150R.

First upper semiconductor liners 152 are formed on the first lower semiconductor liners 151. The first upper semiconductor liners 152 may be formed along the sidewalls and the bottom surface of each of the first source/drain recesses 150R.

The first lower semiconductor liners 151 and the first upper semiconductor liners 152 may be formed by epitaxial growth.

Figure 28:
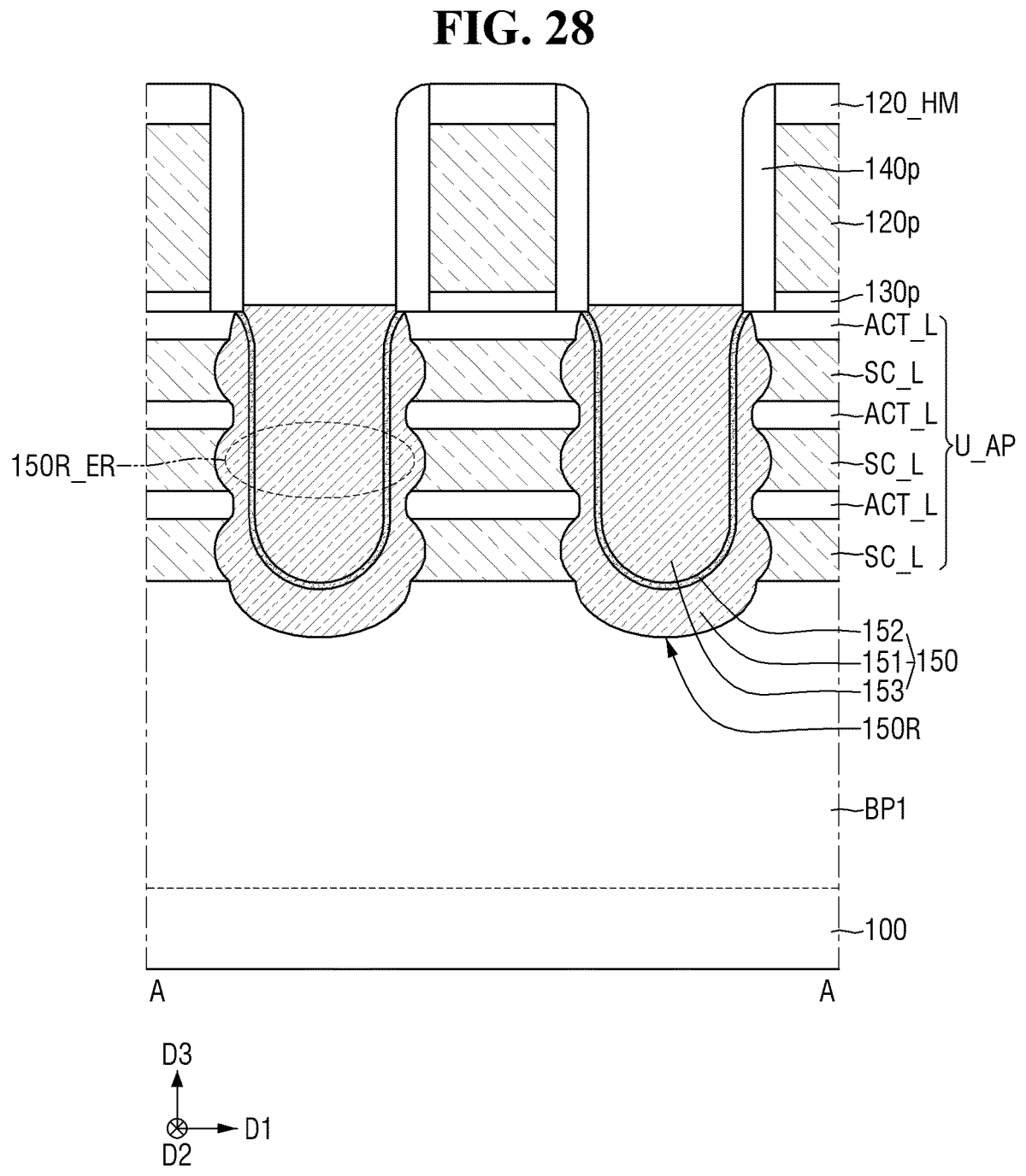

Referring to FIG. 28, a first filling semiconductor film 153 is formed on the first upper semiconductor liners 152.

The first filling semiconductor film 153 may fill the first source/drain recesses 150R. A first source/drain pattern 150 is formed on the first lower pattern BP1.

Figure 29:
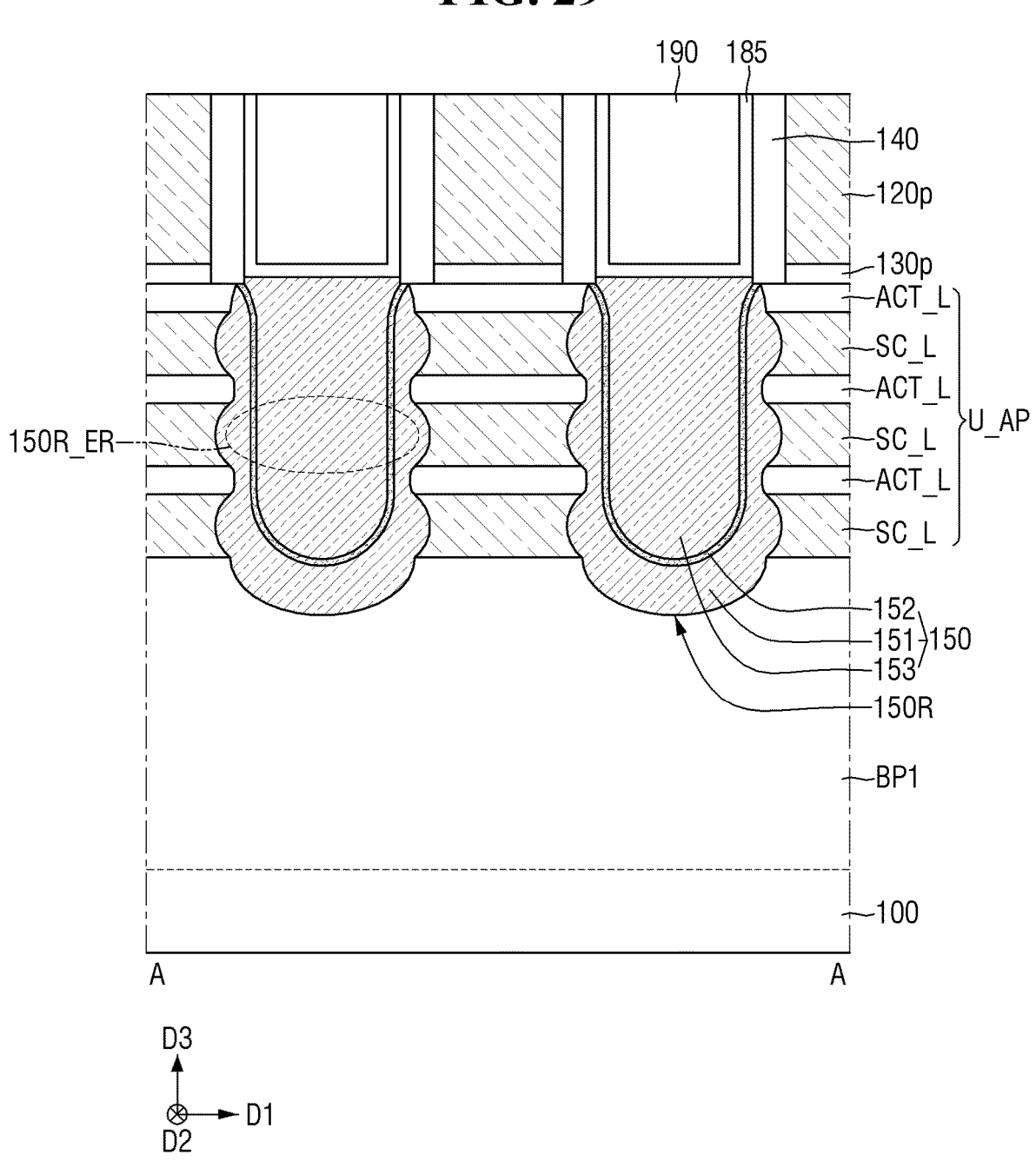

Referring to FIG. 29, source/drain etch stopper films 185 and interlayer insulating films 190 are sequentially formed on the first source/drain pattern 150.

Thereafter, the upper surfaces of the dummy gate electrodes 120*p* are exposed by removing parts of the interlayer insulating films 190, parts of the source/drain etch stopper films 185, and the dummy gate capping films 120_HM. First gate spacers 140 may be formed by etching the pre-gate spacers 140*a* while the upper surfaces of the dummy gate electrodes 120*p* are being exposed.

Figure 30:
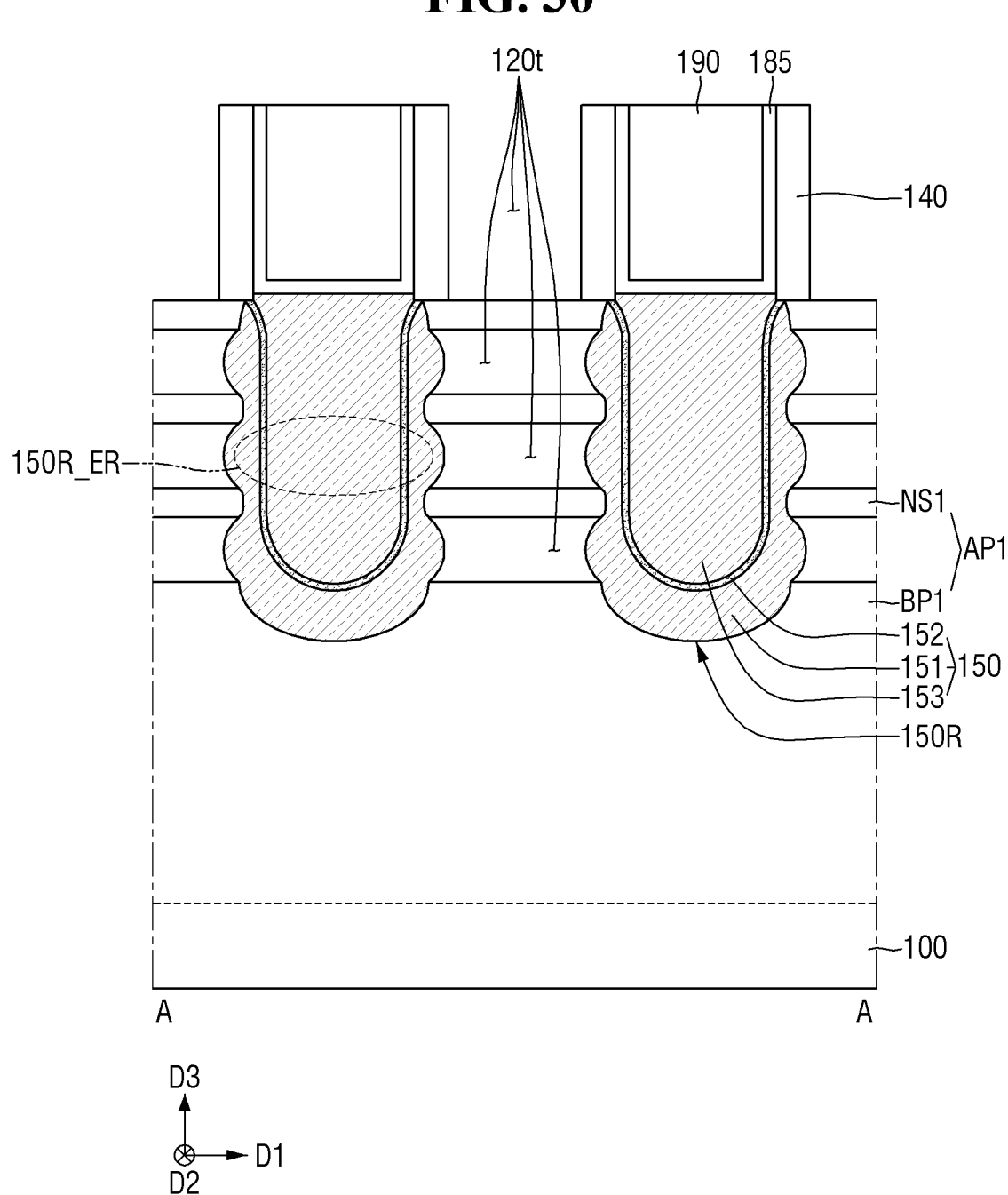

Referring to FIGS. 29 and 30, the upper pattern structure U_AP may be exposed between the first gate spacers 140 by removing the dummy gate insulating films 130*p* and the dummy gate electrodes 120*p*.

Thereafter, first sheet patterns NS1 may be formed by removing the sacrificial patterns SC_L. The first sheet patterns NS1 are connected to the first source/drain pattern 150. Accordingly, a first active pattern AP1 including the first lower pattern BP1 and the first sheet patterns NS1 is formed.

Also, as a result of the removal of the sacrificial patterns SC_L, gate trenches 120*t* are formed between the first gate spacers 140. Once the sacrificial patterns SC_L are removed, parts of the first source/drain pattern 150 may be removed.

Thereafter, referring to FIG. 2, first gate insulating films 130 and first gate electrodes 120 may be formed in the gate trenches 120*t*. Also, first gate capping patterns 145 may be formed.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device comprising:
an active pattern including a lower pattern and a plurality of sheet patterns, which are spaced apart from the lower pattern in a first direction;
a plurality of gate structures disposed on the lower pattern and spaced apart from each other in a second direction, each of the gate structures including a gate electrode and gate insulating film;
source/drain recesses, each defined between a corresponding pair of the gate structures that are adjacent to each other; and
source/drain patterns, each filling a corresponding one of the source/drain recesses,
wherein each of the source/drain patterns include a first semiconductor liner that is continuous and extends along sidewalls and a bottom surface of the corresponding source/drain recess, a second semiconductor liner on the first semiconductor liner, the second semiconductor liner being continuous and extending adjacent to the sidewalls and the bottom surface of the corresponding source/drain recess, and a filling semiconductor film on the second semiconductor liner that fills the corresponding source/drain recess,
wherein the second semiconductor liners are doped with carbon,
wherein each of the first semiconductor liners are in contact with the lower pattern and at least two of the sheet patterns that are spaced apart from each other in the first direction,
wherein the first semiconductor liners include carbon-undoped regions,
wherein the first semiconductor liners include carbon-diffused regions, which extend along the sidewalls and the bottom surface of each of the source/drain recesses,
wherein the carbon-diffused regions are disposed between corresponding ones of the carbon-undoped regions and the second semiconductor liners,
wherein carbon concentrations of the carbon-diffused regions increase in a direction away from the corresponding carbon-undoped region, and
wherein the first semiconductor liners and the second semiconductor liners are formed of a corresponding crystalline semiconductor material.

2. The semiconductor device of claim 1, wherein each carbon-undoped region is continuously formed along the sidewalls and the bottom surface of a corresponding one of the source/drain recesses.

3. The semiconductor device of claim 1, wherein each first semiconductor liner comprises a plurality of the carbon-undoped regions that are discretely formed and separated from another, including first and second sub-carbon-undoped regions, which are spaced apart from each other in the first direction.

4. The semiconductor device of claim 1, wherein each of the gate structures includes inner gate structures, each being disposed between a corresponding pair of adjacent sheet patterns or between the lower pattern and the sheet patterns adjacent to the lower pattern, the inner gate structures including a corresponding portion of the gate electrode of the gate structure and a corresponding one of the gate insulating films of the gate structure, and the first semiconductor liners are in contact with the gate insulating films of corresponding ones of the inner gate structures.

5. The semiconductor device of claim 1, wherein each filling semiconductor film is doped with phosphorus and is in contact with a corresponding one of the second semiconductor liners.

6. The semiconductor device of claim 1, wherein each source/drain pattern further comprises a third semiconductor liner, which is disposed between the second semiconductor liner and the filling semiconductor film of the source/drain pattern, the filling semiconductor film being doped with a first n-type impurities, and the third semiconductor liners being doped with second n-type impurities that are different from the first n-type impurities.

7. The semiconductor device of claim 1, wherein the filling semiconductor films and the first semiconductor liners are doped with boron.

8. The semiconductor device of claim 1, wherein each of the first semiconductor liners and the second semiconductor liners includes a silicon film or a silicon-germanium film.

9. A semiconductor device comprising:

an active pattern including a lower pattern and a plurality of sheet patterns, which are spaced apart from the lower pattern in a first direction;

a plurality of gate structures disposed on the lower pattern and spaced apart from each other in a second direction, each of the gate structures including a gate electrode and gate insulating films;

source/drain recesses, each defined between a corresponding pair of the gate structures that are adjacent to each other, each of the source/drain recesses including a plurality of width-expanded regions; and source/drain patterns, each filling a corresponding one of the source/drain recesses, wherein each of the gate structures includes inner gate structures each being disposed between a corresponding pair of adjacent sheet patterns or between the lower pattern and the sheet pattern adjacent to the lower pattern, the inner gate structures including a corresponding portion of the gate electrode and a corresponding one of the gate insulating films of the gate structure, wherein each of the source/drain pattern includes a first semiconductor liner that is continuous and extends along sidewalls and a bottom surface of the corresponding source/drain recess, a second semiconductor liner on the first semiconductor liner, the second semiconductor liner being continuous and extending adjacent to the sidewalls and the bottom surface of the corresponding source/drain recess, and a filling semiconductor film on the second semiconductor liner that is doped with phosphorus, wherein each second semiconductor liner is disposed between a corresponding first semiconductor liner and a corresponding filling semiconductor film and is doped with carbon, wherein each of the first semiconductor liners include one or more carbon-undoped regions that are in contact with the gate insulating films of the inner gate structures of a corresponding one of the gate structures, wherein a width, in the second direction, of each of the width-expanded regions increases and then decreases with respect to a direction away from an upper surface of the lower pattern and is maximum at a location between a corresponding pair of vertically adjacent sheet patterns or between the lower pattern and the sheet pattern vertically adjacent the lower pattern, wherein each of the first semiconductor liners are in contact with the lower pattern and at least two of the sheet patterns that are spaced apart from each other in the first direction, and wherein the first semiconductor liners and the second semiconductor liners are formed of a corresponding crystalline semiconductor material.

10. The semiconductor device of claim 9, wherein each carbon-undoped region comprises all of a corresponding one of the first semiconductor liners.

11. The semiconductor device of claim 9, wherein each carbon-undoped region is continuously formed along the sidewalls and the bottom surface of a corresponding one of the source/drain recesses.

12. The semiconductor device of claim 11, wherein the first semiconductor liners include carbon-diffused regions, which extend along the sidewalls and the bottom surface of the source/drain recesses, the carbon-diffused regions are disposed between corresponding ones of the carbon-undoped regions and the second semiconductor liners, and carbon concentrations of the carbon-diffused regions increase in a direction away from the corresponding carbon-undoped regions.

13. The semiconductor device of claim 9, wherein each source/drain pattern further comprises a third semiconductor liner disposed between the second semiconductor liner and the filling semiconductor film of the source/drain pattern, the third semiconductor liner being doped with n-type impurities, and the n-type impurities including at least one of arsenic, antimony, or bismuth.

14. The semiconductor device of claim 9, wherein for each source/drain pattern, the corresponding filling semiconductor film is in contact with the corresponding second semiconductor liner.

15. The semiconductor device of claim 9, wherein the filling semiconductor film of at least one of the source/drain patterns includes an airgap.

16. A semiconductor device comprising:

a first active pattern including a first lower pattern and a plurality of first sheet patterns, which are spaced apart from the first lower pattern in a first direction;

a second active pattern including a second lower pattern and a plurality of second sheet patterns, which are spaced apart from the second lower pattern in the first direction;

a plurality of first gate structures disposed on the first lower pattern and spaced apart from each other in a second direction, each of the first gate structures including a first gate electrode and first gate insulating films;

a plurality of second gate structures disposed on the second lower pattern and spaced apart from each other in the second direction, each of the second gate structures including a second gate electrode and second gate insulating films;

first source/drain recesses, each defined between a corresponding pair of the first gate structures that are adjacent to each other;

second source/drain recesses, each defined between a corresponding pair of the second gate structures that are adjacent to each other;

first source/drain patterns, each disposed in a corresponding one of the first source/drain recesses, each of the first source/drain patterns being in contact with the first gate insulating films of a corresponding first gate structure and the first lower pattern; and second source/drain patterns, each disposed in a corresponding one the second source/drain recesses, each of the second source/drain patterns being in contact with the second gate insulating films of a corresponding second gate structure and the second lower pattern and including p-type impurities, wherein each of the first source/drain patterns includes a first lower semiconductor liner that is continuous and extends along sidewalls and a bottom surface of the corresponding first source/drain recess, a first upper semiconductor liner on the first lower semiconductor liner, the first upper semiconductor liner being continuous and extending adjacent to the sidewalls and the bottom surface of the corresponding first source/drain recess, and a first filling semiconductor film doped with phosphorous and on the first upper semiconductor liner, wherein the first upper semiconductor liners each include a silicon film doped with carbon, wherein the first lower semiconductor liners are in contact with the first lower pattern and at least two of the first sheet patterns that are spaced apart from each other in the first direction and include carbon-undoped regions, which extend along the sidewalls and the bottom surface of the corresponding first source/drain recesses, wherein the second source/drain patterns do not include carbon-doped semiconductor liners extending along the sidewalls and the bottom surface of the second source/drain recesses, and wherein the first lower semiconductor liners and the first upper semiconductor liners are formed of a corresponding crystalline semiconductor material.

17. The semiconductor device of claim 16, wherein, for each first source/drain pattern, the corresponding first upper semiconductor liner is in contact with the corresponding first filling semiconductor film.

18. The semiconductor device of claim 16, wherein each of the first source/drain patterns further includes an additional semiconductor liner disposed between the first filling semiconductor film and the first upper semiconductor liner, and the additional semiconductor liners are doped with arsenic.

\* \* \* \* \*